United States Patent
Zhang et al.

(10) Patent No.: US 12,206,003 B2
(45) Date of Patent: Jan. 21, 2025

(54) THIN FILM TRANSISTOR, ARRAY SUBSTRATE AND DISPLAY DEVICE HAVING SLANTED GATE ELECTRODES

(71) Applicants: HEFEI BOE DISPLAY TECHNOLOGY CO., LTD., Hefei (CN); BOE TECHNOLOGY GROUP CO., LTD., Beijing (CN)

(72) Inventors: Yuntian Zhang, Beijing (CN); Zhou Rui, Beijing (CN); Peng Jiang, Beijing (CN); Haipeng Yang, Beijing (CN); Ke Dai, Beijing (CN); Chunxu Zhang, Beijing (CN); Zhonghou Wu, Beijing (CN); Li Tian, Beijing (CN)

(73) Assignees: HEFEI BOE DISPLAY TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/093,063

(22) Filed: Jan. 4, 2023

(65) Prior Publication Data
US 2023/0141490 A1 May 11, 2023

Related U.S. Application Data

(63) Continuation of application No. 17/280,491, filed as application No. PCT/CN2020/120562 on Oct. 13, 2020, now Pat. No. 11,581,413.

(30) Foreign Application Priority Data

Nov. 20, 2019 (CN) .......................... 201911143764.5

(51) Int. Cl.
*H01L 29/423* (2006.01)
*G02F 1/1343* (2006.01)
(Continued)

(52) U.S. Cl.
CPC .. *H01L 29/42384* (2013.01); *G02F 1/134309* (2013.01); *G02F 1/136286* (2013.01);
(Continued)

(58) Field of Classification Search
CPC ..................... G02F 1/136286; G02F 1/134309
See application file for complete search history.

(56) References Cited

U.S. PATENT DOCUMENTS 9,515,091 B2 12/2016 Hwang et al.
9,964,822 B2 5/2018 Wang et al.
(Continued)

FOREIGN PATENT DOCUMENTS

CN            1556437 A      12/2004
CN       103257498 A      8/2013
(Continued)

OTHER PUBLICATIONS

Extended European Search Report from European Patent Application No. 20864332.0 dated May 12, 2022.
(Continued)

*Primary Examiner* — Lauren Nguyen
(74) *Attorney, Agent, or Firm* — Dilworth & Barrese, LLP.; Michael J. Musella, Esq.

(57) ABSTRACT

A thin film transistor, an array substrate and a display device are provided. The thin film transistor is on a base substrate and includes a gate electrode, a first electrode, and a second electrode on the base substrate. The gate electrode includes a first body portion and a first extension portion extending along the first direction, electrically connected with the first body portion, and spaced apart from the first body portion by a first spacing. The first electrode includes a first overlapping end, an orthographic projection of the first overlapping end on the base substrate at least partially overlaps with an orthographic projection of the first body portion on the base
(Continued)

substrate; a first compensation end at a side of the first overlapping end away from the first body portion, an orthographic projection of the first compensation end on the base substrate at least partially overlaps with an orthographic projection of the first extension portion on the base substrate; and a first intermediate portion connecting the first overlapping end and the first compensation end, an orthographic projection of the first intermediate portion on the base substrate is within an orthographic projection of the first spacing on the base substrate.

16 Claims, 14 Drawing Sheets

(51) Int. Cl.
    *G02F 1/1362*     (2006.01)
    *G02F 1/1368*     (2006.01)
    *H01L 27/12*     (2006.01)
    *H01L 29/417*     (2006.01)

(52) U.S. Cl.
    CPC .......... *G02F 1/1368* (2013.01); *H01L 27/124* (2013.01); *H01L 29/41733* (2013.01)

(56) References Cited

U.S. PATENT DOCUMENTS

| | | |
|---|---|---|
| 2005/0041168 A1 | 2/2005 | Jang et al. |
| 2008/0123044 A1* | 5/2008 | Oh .................... G02F 1/136227 349/187 |
| 2014/0191238 A1* | 7/2014 | Hwang ............... H01L 27/1214 257/59 |
| 2017/0084708 A1 | 3/2017 | Hwang et al. |
| 2017/0090259 A1* | 3/2017 | Wang ................ G02F 1/134336 |
| 2018/0011357 A1 | 1/2018 | Lee et al. |
| 2020/0292894 A1 | 9/2020 | Liu et al. |

FOREIGN PATENT DOCUMENTS

| | | |
|---|---|---|
| CN | 103915448 A | 7/2014 |
| CN | 105182643 A | 12/2015 |
| CN | 108983463 A | 12/2018 |
| CN | 209373316 U | 9/2019 |
| CN | 210668384 U | 6/2020 |
| JP | 08122801 A | 5/1996 |
| JP | 2004145346 A | 5/2004 |
| JP | 2005175248 A | 6/2005 |
| JP | 2005196118 A | 7/2005 |
| JP | 2008122969 A | 5/2008 |
| JP | 2008205451 A | 9/2008 |
| JP | 2014132337 A | 7/2014 |
| JP | 2015099331 A | 5/2015 |

OTHER PUBLICATIONS

International Search Report from International Application No. PCT/CN2020/120562 dated Jan. 2021.

Japanese Office Action from Japan Patent Application No. 2022-505485 mailed May 27, 2024.

* cited by examiner

C-C'

THIN FILM TRANSISTOR, ARRAY SUBSTRATE AND DISPLAY DEVICE HAVING SLANTED GATE ELECTRODES

The application claims priority to the Chinese patent application No. 201911143764.5, filed on Nov. 20, 2019, the entire disclosure of which is incorporated herein by reference as a part of the present application.

TECHNICAL FIELD

At least one embodiment of the present disclosure relates to a thin film transistor, an array substrate, and a display device.

BACKGROUND

Local dimming technology can be adopted to improve the display contrast. For example, a liquid crystal display device may include a laminated display liquid crystal panel and a light control liquid crystal panel, and light from a backlight unit enters the display liquid crystal panel after being adjusted by the light control liquid crystal panel, thereby improving the display contrast. The display liquid crystal panel and the light control liquid crystal panel respectively comprise an array substrate, the array substrate comprises a drive circuit, and the drive circuit comprises a thin film transistor array. In the drive circuit of the light control liquid crystal panel, gate lines and data lines may be fold lines or straight lines; the light control liquid crystal panel comprises a light control array, and the light control array comprises a plurality of light control units arranged in an array; each column of light control units corresponds to a data line, and in this column of light control units, the thin film transistors are all located at a same side of the data line, or the thin film transistors in adjacent rows of light control units are located at different sides of the data line.

SUMMARY

At least one embodiment of the present disclosure provides a thin film transistor, the thin film transistor is provided on a base substrate and comprises a gate electrode, a first electrode, and a second electrode that are on the base substrate. The gate electrode comprises: a first body portion extending along a first direction; and a first extension portion extending substantially along the first direction, the first extension portion is electrically connected with the first body portion and spaced apart from the first body portion by a first spacing. The first electrode comprises: a first overlapping end, an orthographic projection of the first overlapping end on the base substrate at least partially overlaps with an orthographic projection of the first body portion on the base substrate; a first compensation end at a side of the first overlapping end away from the first body portion, an orthographic projection of the first compensation end on the base substrate at least partially overlaps with an orthographic projection of the first extension portion on the base substrate; and a first intermediate portion connecting the first overlapping end and the first compensation end, an orthographic projection of the first intermediate portion on the base substrate is within an orthographic projection of the first spacing on the base substrate.

For example, in the thin film transistor provided in an embodiment of the present disclosure, the first intermediate portion comprises a stripe portion extending along the first direction; the first electrode comprises: a plurality of first portions connected with the stripe portion, the plurality of first portions are provided on a first side of the stripe portion near the first body portion, and are spaced apart from each other along the first direction; and a plurality of second portions connected with the stripe portion, the plurality of second portions are provided on a second side of the stripe portion near the first extension portion, and are spaced apart from each other along the first direction, and the first overlapping end comprises at least a part of each of the plurality of first portions, and the first compensation end comprises at least a part of each of the plurality of second portions.

For example, in the thin film transistor provided in an embodiment of the present disclosure, each of the plurality of first portions comprises a first region and a second region, an orthographic projection of the first region on the base substrate is within the orthographic projection of the first body portion on the base substrate; an orthographic projection of the second region on the base substrate does not overlap with the orthographic projection of the first body portion on the base substrate, and the orthographic projection of the second region on the base substrate is within the orthographic projection of the first spacing on the base substrate; each of the plurality of second portions comprises a third region and a fourth region, an orthographic projection of the third region on the base substrate is within an orthographic projection of the first extension portion on the base substrate, and an orthographic projection of the fourth region on the base substrate does not overlap with the orthographic projection of the first extension portion of the first extension on the base substrate, and the orthographic projection of the fourth region on the base substrate is within the orthographic projection of the first spacing on the base substrate.

For example, in the thin film transistor provided in an embodiment of the present disclosure, the plurality of first portions correspond to the plurality of second portions one by one, and the plurality of first portions and the plurality of second portions are axially symmetrical with the stripe portion as an axis of symmetry.

For example, in the thin film transistor provided in an embodiment of the present disclosure, each of the plurality of first portions is perpendicular to the first direction, and each of the plurality of second portions is perpendicular to the first direction.

For example, in the thin film transistor provided in an embodiment of the present disclosure, an orthographic projection of the second electrode on the base substrate at least partially overlaps with the orthographic projection of the first body portion on the base substrate; the second electrode comprises a plurality of first recessed portions which are arranged in the first direction and recessed in a direction away from the first extension portion, the first electrode further comprises a plurality of first protrusion portions corresponding to the first portions one by one, each of the plurality of first protrusion portions is connected with the corresponding first portion, and the first protrusion portions respectively extend into the first recessed portions one by one; and the first overlapping end further comprises the plurality of first protrusion portions.

For example, in the thin film transistor provided in an embodiment of the present disclosure, the first body portion has an edge near the first extension portion, and an orthographic projection of the edge on the base substrate at least partially overlaps with orthographic projections of the plurality of first portions on the base substrate, and a width, in the first direction, of each of the first portions is larger than a width, in the first direction, of the first protrusion connected with the respective first portion.

For example, in the thin film transistor provided in an embodiment of the present disclosure, a width of the first extension portion in a direction perpendicular to the first direction is greater than 0 and less than or equal to 3 μm; a ratio of the width of the first extension portion in the direction perpendicular to the first direction to a width of the first body portion in the direction perpendicular to the first direction is in a range of 0.2-0.3.

For example, in the thin film transistor provided in an embodiment of the present disclosure, the gate electrode further comprises a first connection portion connecting the first body portion and the first extension portion, and an orthographic projection of the first connection portion on the base substrate does not overlap with both an orthographic projection of the first electrode on the base substrate and an orthographic projection of the second electrode on the base substrate.

For example, in the thin film transistor provided in an embodiment of the present disclosure, the first extension portion has a first end and a second end in the first direction, and the first body portion has a first end and a second end in the first direction; the first connection portion connects the first end of the first extension portion with the first end of the first body portion; and the second end of the first extension portion and the second end of the first body portion are at a same side of the first connection portion.

For example, in the thin film transistor provided in an embodiment of the present disclosure, an included angel between the first direction and the horizontal direction is greater than 0 degree and less than 90 degrees.

At least one embodiment of the present disclosure also provides an array substrate, comprising: a plurality of first signal lines extending along a second direction and a plurality of second signal lines extending along a third direction which are on the base substrate. The second direction and the third direction intersect with each other, and the plurality of first signal lines intersect with the plurality of second signal lines to define a plurality of light control units in an array; each of the light control units comprises any of the thin film transistors of the embodiments of the present disclosure. The first direction intersects with both the second direction and the third direction, the gate electrode of the thin film transistor is electrically connected with one of the plurality of first signal lines, and the first electrode of the thin film transistor or the second electrode of the thin film transistor is electrically connected with one of the plurality of second signal lines. The plurality of first signal lines and the plurality of first signal lines are provided on the base substrate.

For example, in the array substrate provided in an embodiment of the present disclosure, the plurality of light control units comprise a first light control unit and a second light control unit; and the first direction in the thin film transistor comprised in the first light control unit intersects with the first direction in the thin film transistor comprised in the second light control unit.

For example, in the array substrate provided in an embodiment of the present disclosure, the thin film transistor comprised in the first light control unit and a thin film transistor comprised in the second light control unit are connected with a same second signal line and are respectively at a first side of the same second signal line and a second side of the same second signal line, and the first side of the same second signal line and the second side of the same second signal line are opposite to each other in the second direction.

For example, in the array substrate provided in an embodiment of the present disclosure, the first light control unit and the second light control unit are respectively in two adjacent light control unit rows arranged in the third direction, and the first light control unit and the second light control unit are respectively in two adjacent light control unit columns arranged in the second direction.

For example, in the array substrate provided in an embodiment of the present disclosure, for the thin film transistor comprised in the first light control unit, an area of an orthographic projection of the first compensation end of the first electrode on the base substrate is a first area, and an area of an orthographic projection of the first overlapping end of the first electrode on the base substrate is a third area, for the thin film transistor comprised in the second light control unit, an area of an orthographic projection of the first compensation end of the first electrode on the base substrate is a second area, and an area of an orthographic projection of the first overlapping end of the first electrode on the base substrate is a fourth area. The first area is different from the second area, and the third area is different from the fourth area, and a sum of the first area and the second area is same as a sum of the third area and the fourth area.

For example, in the array substrate provided in an embodiment of the present disclosure, the thin film transistor comprised in the first light control unit and the thin film transistor comprised in the second light control unit are axially symmetrical with respect to an axis of symmetry along the third direction; or, the thin film transistor comprised in the first light control unit after being displaced along the third direction and the thin film transistor comprised in the second light control unit are axially symmetrical with respect to the symmetry axis along the third direction.

For example, in the array substrate provided in an embodiment of the present disclosure, at least a part of the plurality of first signal lines are fold lines, each of which comprises a plurality of first fold line units arranged continuously and periodically, and each of the first fold line units corresponds to a corresponding one of the light control units; each of the first fold line units comprises a first line segment extending along a fourth direction and a second line segment extending along a fifth direction. The fourth direction intersects with the fifth direction, and both the fourth direction and the fifth direction intersect with both the second direction and the third direction. The first line segment and the second line segment are sequentially arranged in the second direction, the first line segment comprises a first end connected with the second line segment, and the second line segment comprises a first end connected with the first end of the first line segment, and a connection point of the first end of the first line segment and the first end of the second line segment is a knee point of the first fold line unit. In the first light control unit, the first body portion is connected with the first line segment of the first fold line unit; and in the second light control unit, the first body portion is connected with the second line segment of the first fold line unit.

For example, in the array substrate provided in an embodiment of the present disclosure, the first direction in the thin film transistors comprised in the first light control unit is same as the fifth direction, and the first direction in the thin film transistors comprised in the second light control unit is same as the fourth direction.

For example, in the array substrate provided in an embodiment of the present disclosure, the first line segment comprises a second end connected with the second line segment of the first fold line unit adjacent thereto, and the second line segment comprises a second end connected with a second end of the first line segment of first fold line unit adjacent thereto; an orthographic projection of a connection point of the second end of the first line segment and the second end of the second line segment on the base substrate is on an orthographic projection of the second signal line on the base substrate; in the first light control unit, the second end of the first line segment is closer to the thin film transistor than the first end of the first line segment; and in the second light control unit, the second end of the second line segment is closer to the thin film transistor than the first end of the second line segment.

For example, in the array substrate provided in an embodiment of the present disclosure, at least a part of the plurality of second signal lines are fold lines, each of which comprises a plurality of second fold line units arranged continuously and periodically, and each of the second fold line units corresponds to a corresponding one of the light control units; each of the second fold line units comprises a first line segment extending along a sixth direction and a second line segment extending along a seventh direction. The sixth direction intersects with the seventh direction, and both the sixth direction and the seventh direction intersect with both the second direction and the third direction; the first line segment and the second line segment are sequentially arranged along the third direction. The first line segment comprises a first end connected with the second line segment, the second line segment comprises a first end connected with the first end of the first line segment, and a connection point between the first end of the first line segment and the first end of the second line segment is a knee point of the second fold line unit. In the first light control unit, the first electrode of the thin film transistor or the second electrode of the thin film transistor is connected with the first line segment of the second fold line unit; and in the second light control unit, the first electrode of the thin film transistor or the second electrode of the thin film transistor is connected with the first line segment of the second fold line unit.

For example, in the array substrate provided in an embodiment of the present disclosure, at least part of the second signal lines is a straight line.

At least one embodiment also provides a display device, comprising any of the array substrates of the present disclosure. The array substrate is a light control substrate, and the display device further comprises: a light control panel comprising the light control substrate; a display liquid crystal panel stacked with the light control panel and comprising a plurality of first display signal lines extending along the second direction and a plurality of second display signal lines extending along the third direction; the plurality of first display signal lines intersect with the plurality of second display signal lines to define a plurality of sub-pixel units in an array; and a backlight unit at a side of the light control panel away from the display liquid crystal panel. The light control panel is configured to allow backlight from the backlight unit to be incident into the display liquid crystal panel via the light control panel.

BRIEF DESCRIPTION OF THE DRAWINGS

In order to clearly illustrate the technical solution of the embodiments of the disclosure, the drawings of the embodiments will be briefly described in the following; it is apparent that the described drawings are only related to some embodiments of the disclosure and are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a portion but not all of the embodiments of the disclosure. Based on the described embodiments herein, those skilled in the art can obtain other embodiment (s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," or the like, which are used in the description and the claims of the present application for disclosure, are not intended to indicate any sequence, amount or importance, but distinguish various components. Also, the terms "comprise," "comprising," "include," "including," or the like, are intended to specify that the elements or the objects stated before these terms encompass the elements or the objects and equivalents thereof listed after these terms, but do not preclude other elements or objects. "Inside," "outside," "on," "under" or the like are only used to indicate relative position relationship, and when the absolute position of the object which is described is changed, the relative position relationship may be changed accordingly.

The figures in embodiments of the present disclosure are not drawn according to actual proportions or scales. An amount of light control units and an amount of thin film transistors are not limited to the amounts as illustrated in the figures, specific sizes and amount of the various structure can be determined according to actual requirements, and the figures of the embodiments of the present disclosure are only schematically structure views.

Generally, in a drive circuit of a liquid crystal panel, gate lines and data lines crossing each other define a plurality of pixel units in an array. The drive circuit further includes a thin film transistor array including a plurality of thin film thin film transistors arranged in an array. Each column of pixels corresponds to a data line, and the thin film transistors in each column of pixel units may be arranged at a same side of the data line, or the thin film transistors in two adjacent rows may be respectively arranged at two sides of the data line respectively. In a process of manufacturing the thin film transistor array of the display panel, there is often a load difference between the parasitic capacitances of the thin film transistors in different rows of pixel units or different columns because of a relative position deviation between different layers of metals, resulting in abnormal display of the panel, such as horizontal stripes, which affects the display quality.

Figure 3A:
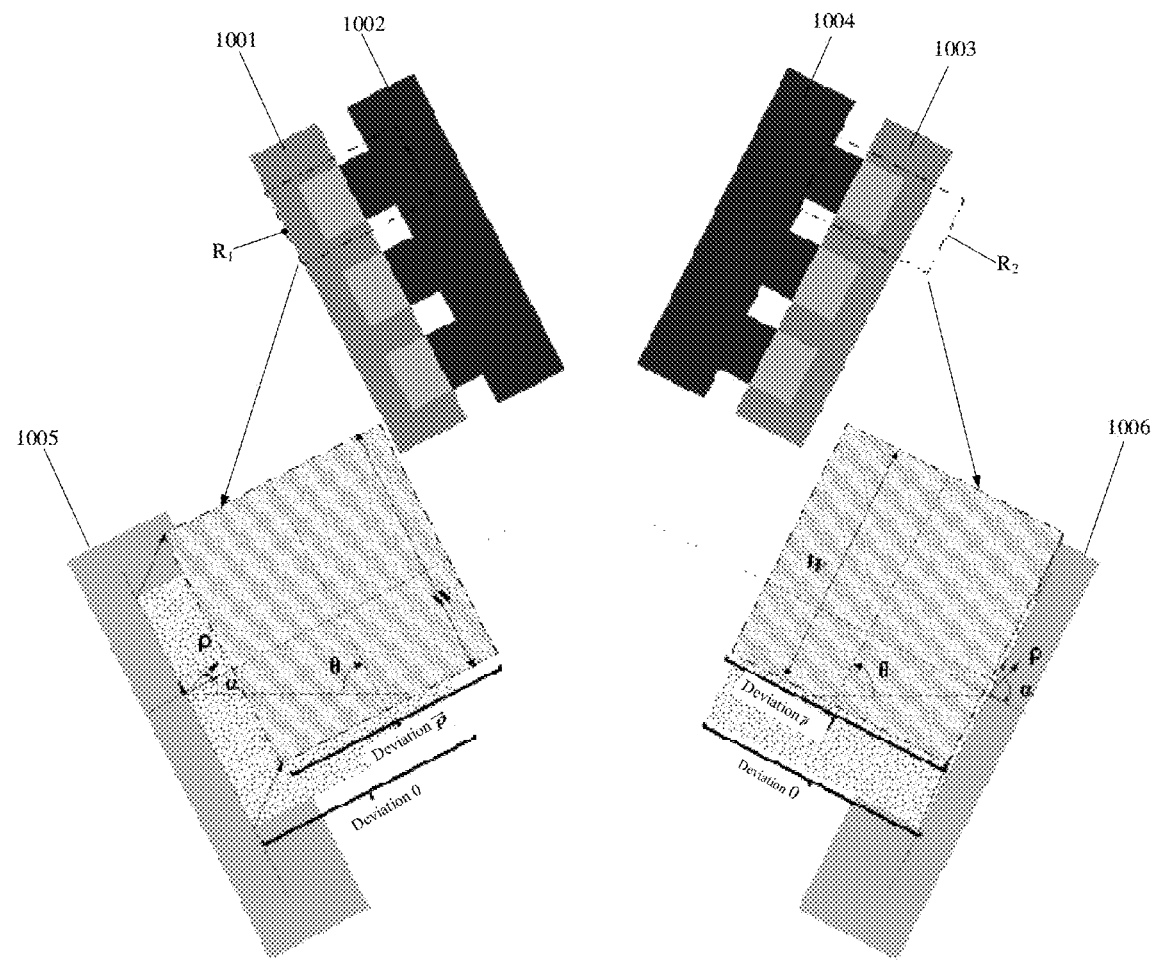
FIG. 3A is a schematic diagram showing an alignment deviation of a thin film transistor changing a parasitic capacitance.

FIG. 3A is a schematic diagram showing the above alignment deviation of a thin film transistor changing the parasitic capacitance. As illustrated in FIG. 3A, a first thin film transistor includes a gate electrode 1001 and a source electrode 1002, and a second thin film transistor includes a gate electrode 1003 and a source electrode 1004. A horizontal direction is different from all of an extension direction of the gate electrode 1001, an extension direction of the source electrode 1002, an extension direction of the gate electrode 1003, and an extension direction of the source electrode 1004, the extension direction of the gate electrode 1001 and the extension direction of the gate electrode 1003 are different, and the extension direction of the source electrode 1002 and the extension direction of source electrode 1004 are different. For the first thin film transistor in FIG. 3A, because of process errors, in the case that the source electrode 1002 is relatively offset from the gate electrode 1001 in the horizontal direction, for example, the source electrode 1002 is offset to the right, an overlapping area between the gate electrode 1001 and the source electrode 1002 of the first thin film transistor is reduced, and the source electrode 1004 is offset to the right; for the first thin film transistor in FIG. 3A, because of process errors, in the case that the source electrode 1004 is relatively offset from the gate electrode 1003 in the horizontal direction, for example, the source electrode 1004 is offset to the right, an overlapping area between the gate electrode 1003 and the source electrode 1004 of the second thin film transistor increases.

A region R1 of the first thin film transistor and a region R2 of the second thin film transistor are described as examples. According to the calculation formula of plate capacitor:

$$C_{gs} = \frac{\varepsilon_r \varepsilon_0 A}{d} C$$

For example, as illustrated in FIG. 3A, both an included angle between a gate line 1005 connected to the gate electrode 1001 and the horizontal direction, and an included angle between a gate line 1006 connected to the gate electrode 1003 and the horizontal direction are θ. In the case that the source electrode 1002 has a displacement deviation $\vec{\rho}$ (with a value equal to |ρ|, and having an included angle α with the horizontal direction) with respect to the gate electrode 1001, an overlapping area of the gate electrode 1001 of the first thin film transistor and the source electrode 1002 of the first thin film transistor decreases by $$w|\rho|\cos\left(\alpha + \theta - \frac{\pi}{2}\right);$$

similarly, in the case that the gate electrode 1004 has a displacement deviation $\vec{\rho}$ (with a value equal to |ρ|, and having an included angle α with the horizontal direction) with respect to the source electrode 1002, the overlapping area of the gate electrode 1001 of the first thin film transistor and the source electrode 1002 of the first thin film transistor decreases by $$w|\rho|\cos\left(\alpha + \theta - \frac{\pi}{2}\right).$$

If the above displacement deviations of thin film transistors are different in the display panel, the parasitic capacitances of different thin film transistors are different, which causes uneven display at different positions of the display panel and affects the display quality. For example, in the case that the first thin film transistor and the second thin film transistor illustrated in FIG. 3A are respectively located in adjacent rows of pixel units and adjacent columns of pixel units of the display panel, the coupling capacitance between the odd rows and even rows of pixel units are different, resulting in horizontal stripes of display.

At least one embodiment of the present disclosure provides a thin film transistor, the thin film transistor is disposed on a base substrate and includes a gate electrode, a first electrode, and a second electrode on the base substrate. The gate includes a first body portion and a first extension portion; the first body portion extends in a first direction; the first extension portion extends substantially along the first direction, the first extension portion is electrically connected with the first body portion and is spaced apart from the first body portion by a first spacing. The first electrode comprises a first overlapping end, a first compensation end, and a first intermediate portion; an orthographic projection of the first overlapping end on the base substrate at least partially overlaps with an orthographic projection of the first body portion on the base substrate; the first compensation end is at a side of the first overlapping end away from the first body portion, an orthographic projection of the first compensation end on the base substrate at least partially overlaps with an orthographic projection of the first extension portion on the base substrate. The first intermediate portion connects the first overlapping end and the first compensation end, and an orthographic projection of the first intermediate portion on the base substrate is within an orthographic projection of the first spacing on the base substrate. The thin film transistor provided by embodiments of the disclosure can be used in any circuit or substrate that needs to use the thin film transistor. The base substrate is, for example, an array substrate, such as a display substrate or a light control substrate. The circuit is, for example, a display drive circuit, an light control drive circuit of a light control substrate, etc., so as to solve a problem of capacitance difference caused by an alignment deviation between the gate electrode and the source electrode/drain electrode of the thin film transistor in the array substrate or circuit, and achieve a technical effect of compensating the capacitance difference.

Figure 1A:
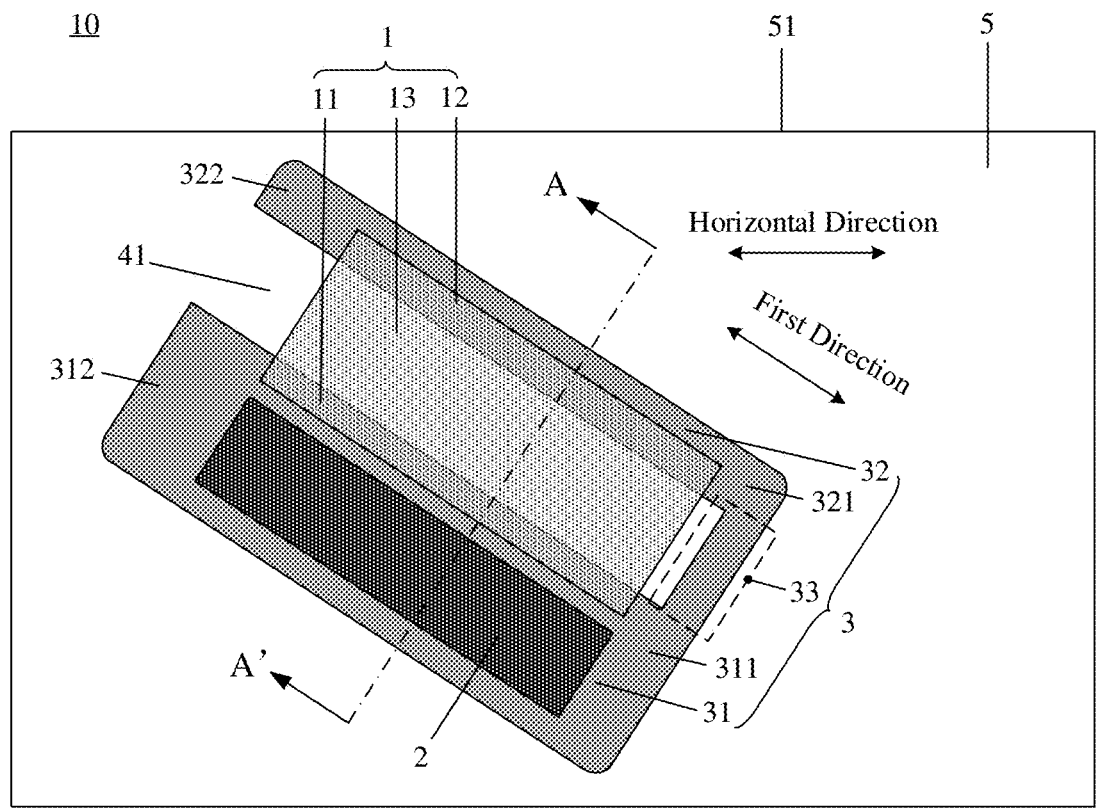
FIG. 1A is a schematic plan view of a thin film transistor provided by an embodiment of the present disclosure.
Figure 1B:
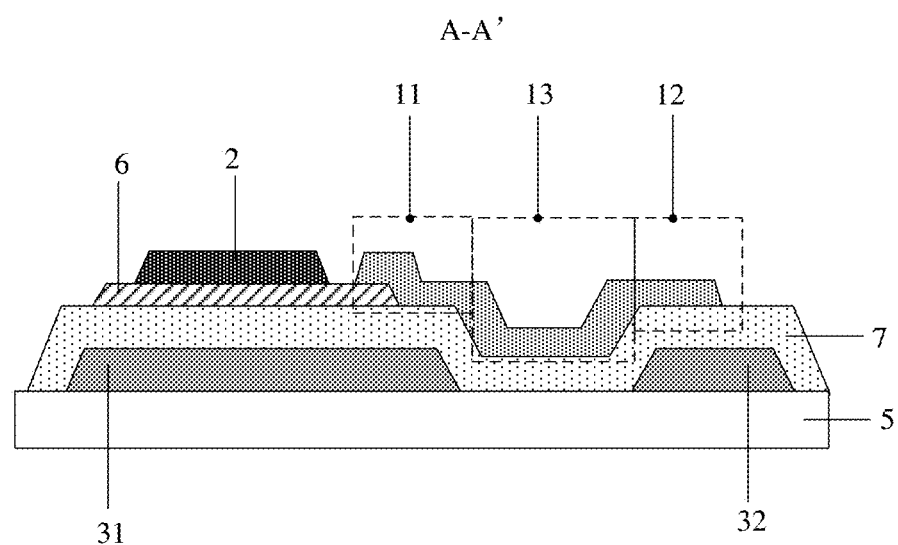
FIG. 1B is a schematically cross-sectional view taken along the line A-A' in FIG. 1A.

FIG. 1A is a schematic plan view of a thin film transistor provided by an embodiment of the present disclosure, FIG. 1B is a schematically cross-sectional view taken along the line A-A' in FIG. 1A. As illustrated in FIG. 1A and FIG. 1B, a thin film transistor 10 includes a gate electrode 3, a first electrode 1, and a second electrode 2 on a base substrate 5. The gate electrode 3 includes a first body portion 31 and a first extension portion 32. The first body portion 31 extends in a first direction; the first extension portion 32 extends substantially along the first direction, the first extension portion 32 is electrically connected with the first body portion 31 and is spaced apart from the first body portion 31 by a first spacing 41. For example, the first spacing 41 extends along the first direction, and for example, the positions of the first extension portion 32 that are not connected with the first body portion 31 are all spaced apart from the first body portion 31 by the first spacing 41. The first electrode 1 includes a first overlapping end 11, a first compensation end 12, and a first intermediate portion 13. An orthographic projection of the first overlapping end 11 on the base substrate 5 at least partially overlaps with an orthographic projection of the first body portion 31 on the base substrate 5. The first compensation end 12 is located at a side of the first overlapping end 11 away from the first body portion 31, and an orthographic projection of the first compensation end 12 on the base substrate 5 overlaps with a part of an orthographic projection of the first extension portion 32 on the base substrate 5. In other embodiments, the orthographic projection of the first compensation end 12 on the base substrate 5 may overlap with an entity of a width, perpendicular to the first direction, of the orthographic projection of the first extension portion 32 on the base substrate 5, for example, the orthographic projection of the first compensation end 12 on the base substrate 5 overlaps with an entity of the orthographic projection of the first extension portion 32 on the base substrate 5. The first intermediate portion 13 connects the first overlapping end 11 and the first compensation end 12, and an orthographic projection of the first intermediate portion 13 on the base substrate 5 is within an orthographic projection of the first spacing 41 on the base substrate 5, that is, the first intermediate portion 13 is located in the first spacing 41 and does not overlap with the gate electrode 3 in a direction perpendicular to the base substrate 5. For example, as illustrated in FIG. 1A, the first overlapping end 11, the first compensation end 12 and the first intermediate portion 13 are all in a strip shape extending along the first direction. For example, an orthographic projection of the second electrode 2 on the base substrate 5 at least partially overlaps with the orthographic projection of the first body portion 31 on the base substrate 5. For example, in FIG. 1A, the orthographic projection of the second electrode 2 on the base substrate 5 is within the orthographic projection of the first body portion 31 on the base substrate.

As illustrated in FIG. 1B, the thin film transistor 10 further includes a semiconductor layer 6 overlapping with the gate electrode 3 in the direction perpendicular to the base substrate 5, and a gate insulation layer 7 covering the gate electrode 3. The orthographic projection of the semiconductor layer 6 on the base substrate 5 is within an orthographic projection of the gate electrode 3 on the base substrate 5, so as to improve the light transmittance of a panel (such as a light control panel or a display panel) which adopts the thin film transistor 10.

Figure 3B:
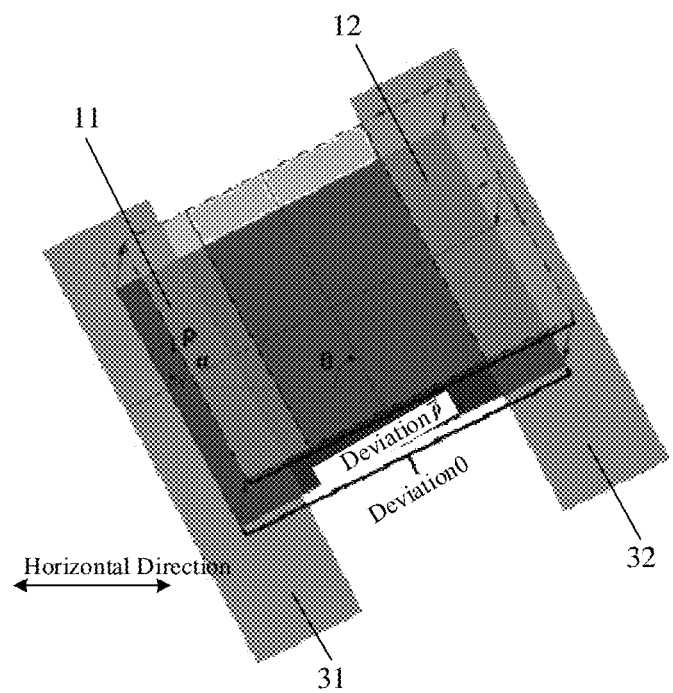
FIG. 3B is a schematic diagram of capacitance compensation when an alignment deviation occurs in a thin film transistor provided by an embodiment of the present disclosure.

In a process of preparing the thin film transistor 10, if the above displacement deviation exists, the first extension portion 32 and the first compensation terminal 11 can compensate for the displacement deviation. Specifically, FIG. 3B is a schematic diagram of capacitance compensation when an alignment deviation occurs in a thin film transistor provided by an embodiment of the present disclosure. As illustrated in FIG. 3B, in the case that a metal layer used to form the first electrode 1 and the second electrode 2 has displacement deviation relative to the gate electrode 3, the formed first electrode 1 and the second electrode 2 have a displacement deviation with the gate electrode 3, for example, the displacement deviation $\vec{\rho}$ (with a value equal to $|\rho|$, and having an included angle $\alpha$ with the horizontal direction). Both an included angle between the first body portion 31 and the horizontal direction, and an included angle between the first extension portion 32 and the horizontal direction are $\theta$. In a case that the first electrode 1 has a displacement deviation $\vec{\rho}$ (with a value equal to $|\rho|$, having an included angle $\alpha$ with the horizontal direction) between the first body portion 31 and the first electrode, an overlapping area of the first body portion 31 of the gate 3 and the first electrode 1 decreases by $$w|\rho|\cos\left(\alpha+\theta-\frac{\pi}{2}\right),$$

while an overlapping area between the first extension portion 32 of the gate 3 and the first electrode 1 increases by $$w|\rho|\cos\left(\alpha+\theta-\frac{\pi}{2}\right),$$

such that the overlapping area between the gate 3 and the first electrode 1 is basically un-changed. In this way, the thin film transistor 10 provided by the embodiment of the present disclosure can prevent the coupling capacitance difference caused by the above displacement deviation, so that the display abnormality caused by the coupling capacitance difference can be avoided in the display panel adopting the thin film transistor.

It should be noted that the horizontal direction is a reference direction, and as illustrated in FIG. 1A, the horizontal direction is, for example, the extension direction of an edge 51 of the base substrate 5.

For example, the first direction may be any direction, and an included angle between the first direction and the horizontal direction is greater than 0 degree and less than 90 degrees, that is, the first direction is inclined relative to the horizontal direction. Therefore, in the case that the display panel includes a plurality of thin film transistors provided by the embodiment of the present disclosure, and the first directions of the plurality of thin film transistors are different from each other, and in the case that there is a displacement deviation between the gate electrode and the first electrode of the thin film transistor in the horizontal direction or in a vertical direction or both directions, for example, the above-mentioned deviation $\vec{\rho}$ exists, the overlapping area of the gate electrode 3 and the first electrode 1 basically remains unchanged. In this way, capacitance compensation is realized, and the coupling capacitance difference caused by the above-mentioned displacement deviation is avoided.

In the embodiments of the present disclosure, for example, the first electrode 1 is a source electrode and the second electrode 2 is a drain electrode, or the first electrode 1 is a drain electrode and the second electrode 2 is a source electrode.

For example, the gate electrode 3 further includes a first connection portion 33 which connects the first body portion 31 and the first extending part 32. An orthographic projection of the first connection portion 33 on the base substrate 5 does not overlap with an orthographic projection of the first electrode 1 on the base substrate 5 and does not overlap with an orthographic projection of the second electrode 2 on the base substrate 5, so as to avoid the difference in coupling capacitance between the gate electrode 3 and the first electrode 1 as well as the second electrode 2 caused by the displacement error of the first connection portion 33 to change the overlapping area between the gate electrode, the first electrode 1, and the second electrode 2.

For example, the first extension portion 32 has a first end 321 and a second end 322 in the first direction, and the first body portion 31 has a first end 311 and a second end 312 in the first direction; the first connecting portion 33 connects the first end 321 of the first extension portion 32 and the first end 311 of the first body portion 31. The second end 322 of the first extension portion 32 and the second end 312 of the first body portion 31 are located at a same side of the first connection part 33, which is beneficial to enabling the structure of the thin film transistor 10 to be compact, reducing the size of the thin film transistor and reducing the space occupied by the thin film transistor in the display panel adopting the thin film transistor.

For example, a width of the first extension portion 32 in the direction perpendicular to the first direction is greater than 0 and less than or equal to 3 μm; a ratio of the width of the first extension portion in the direction perpendicular to the first direction to a width of the first body portion in the direction perpendicular to the first direction is 0.2-0.3. The embodiments of the present disclosure are not limited to this, and the width of the first extension portion 32 and the ratio of the width of the first extension portion to the width of the first body portion can be designed according to actual process errors.

Figure 2A:
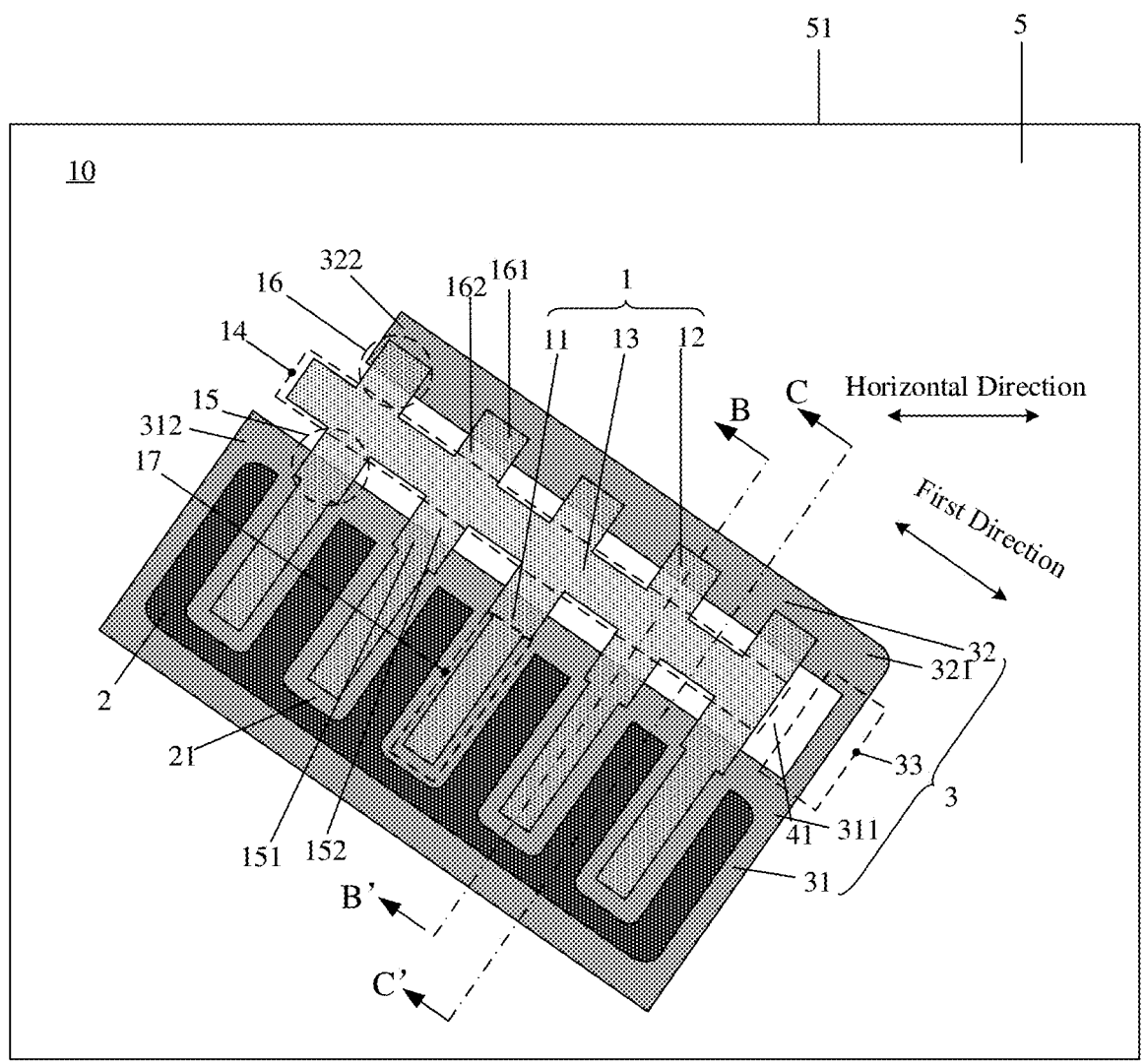
FIG. 2A is a schematic plan view of another thin film transistor provided by an embodiment of the present disclosure.
Figure 2B:
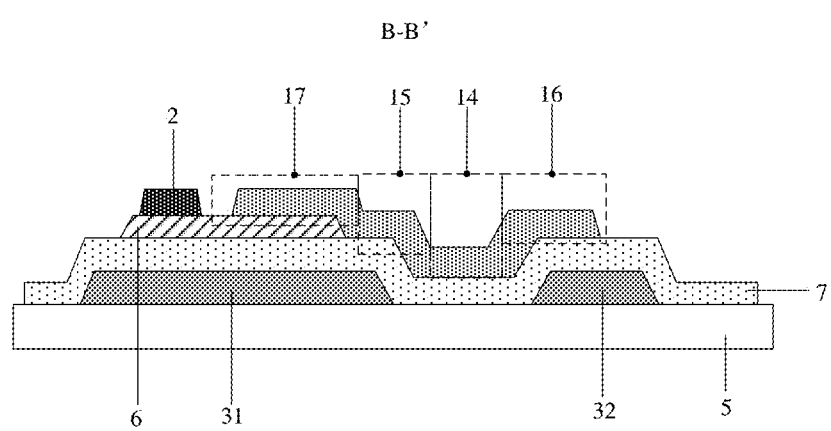
FIG. 2B is a schematically cross-sectional view taken along the line B-B' in FIG. 2A.
Figure 2C:
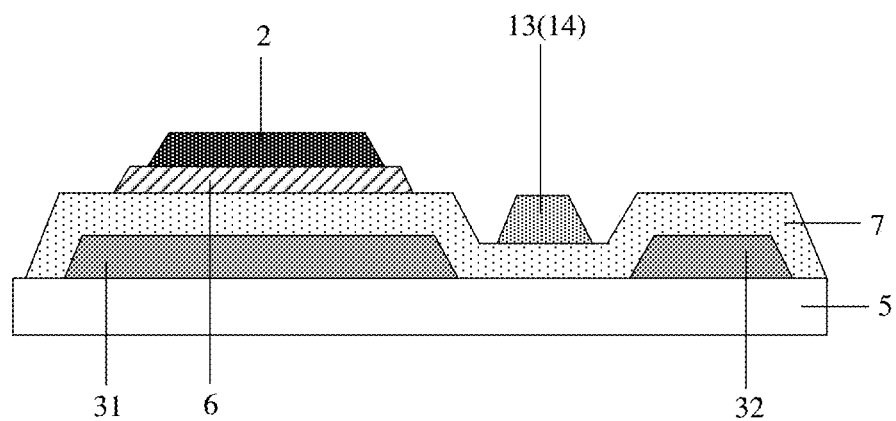
FIG. 2C is a schematically cross-sectional view taken along the line C-C in FIG. 2A.
Figure 3C:
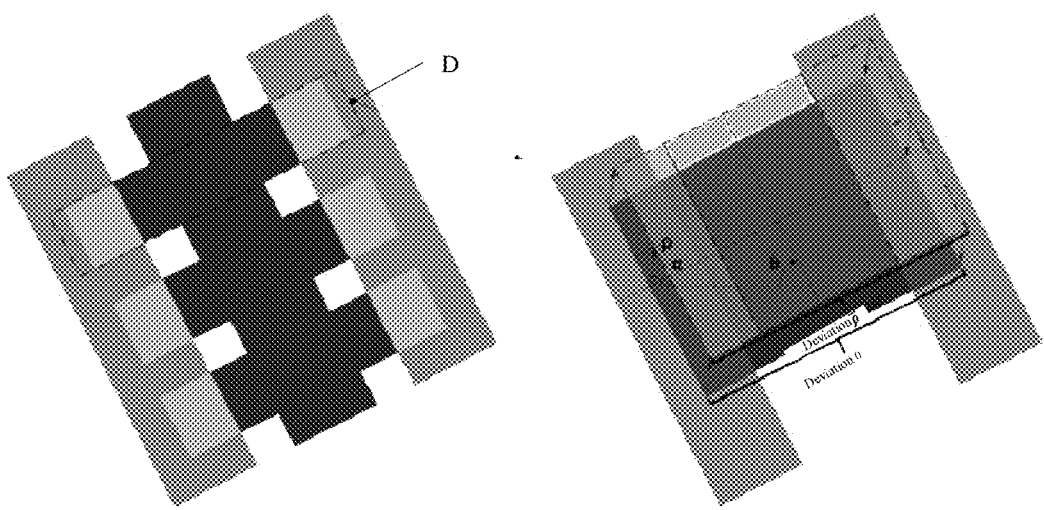
FIG. 3C is a schematic diagram of capacitance compensation when alignment deviation occurs in a thin film transistor provided by another embodiment of the present disclosure.

FIG. 2A is a schematic plan view of another thin film transistor provided by an embodiment of the present disclosure, FIG. 2B is a schematically cross-sectional view taken along the line B-B' in FIG. 2A, and FIG. 2C is a schematically cross-sectional view taken along the line C-C in FIG. 2A. As illustrated in FIG. 2A-FIG. 2C, the first intermediate portion 13 includes a stripe portion 14 extending along the first direction. The first electrode 1 includes a plurality of first portions 15 and a plurality of second portions 16; the plurality of first portions 15 are connected with the stripe portion 14, located on a first side of the stripe portion 14 near the first body portion 31, and arranged at a spacing in the first direction; the plurality of second portions 16 are connected with the strip-shaped part 14, located on a second side of the strip-shaped part 14 near the first extending part 32, and arranged at a spacing in the first direction, that is, the plurality of first portions 15 and the plurality of second portions 16 are respectively at opposite sides of the strip-shaped part 14. Furthermore, the first overlapping end 11 includes at least a part of each of the plurality of first portions 15. For example, as illustrated in FIG. 2A, each of the plurality of first portions 15 includes a first region 151 and a second region 152, and an orthographic projection of the first region 151 on the base substrate 5 is within the orthographic projection of the first body portion 31 on the base substrate 5. An orthographic projection of the second region 152 on the base substrate 5 does not overlap with the orthographic projection of the first body portion 31 on the base substrate 5, but is within the orthographic projection of the first spacing 41 on the base substrate 5. The first compensation terminal 12 includes at least a part of each of a plurality of second portions 16, so as to solve the problem of capacitance difference of each first portion 15 caused by the above-mentioned deviation error and realize the capacitance compensation. For example, as illustrated in FIG. 2A, each of the plurality of second portions 16 includes a third region 161 and a fourth region 162, and an orthographic projection of the third region 161 on the base substrate 5 is within the orthographic projection of the first extension portion 32 on the base substrate 5. An orthographic projection of the fourth region 162 on the base substrate 5 does not overlap with the orthographic projection of the first extension portion 32 on the base substrate 5, but is within the orthographic projection of the first spacing 41 on the base substrate 5. As illustrated in FIG. 3C, for each first portion 15 and the corresponding second portion 16 in the thin film transistor 10, the capacitance compensation of the region D is the same as that illustrated in FIG. 3B, the previous description may be referred.

For example, as illustrated in FIG. 2A, the plurality of first portions 15 are perpendicular to the first direction, and the plurality of second portions 16 are perpendicular to the first direction; the whole structure composed of the plurality of first portions 15, the stripe portion 14 and the plurality of second portions 16 is in a fishbone shape. In addition, the plurality of first portions 15 correspond to the plurality of second portions 16 one by one, and the plurality of first portions 15 and the plurality of second portions 16 are axially symmetrical with the stripe portion 14 as an axis of symmetry. In this way, a width of each of the plurality of first portions 15 in the direction perpendicular to the first direction is equal to a width of the corresponding second portion 16 in the direction perpendicular to the first direction. In this case, the structure of the thin film transistor is simple and the capacitance compensation effect is the best. For example, the plurality of first portions 15 are perpendicular to the first direction, and the plurality of second portions 16 are perpendicular to the first direction. In this case, if the above displacement error occurs, the change amount of the overlapping area between each first portion 15 and the first body portion 31 and the change amount of the overlapping area between each second portion 16 and the first extension portion 32 are closer to each other, and the compensation effect is better. In other embodiments, each of the first portions 15 may not be perpendicular to the first direction, and each of the second portions 16 may not be perpendicular to the first direction. For example, a plan pattern of each of the first portions 15 is rectangular, and a plan pattern of each of the second portions 16 is rectangular. Compared with other patterns, in the case that the above displacement error occurs, the change amount of the overlapping area between each first portion 15 and the first body portion 31 and the change amount of the overlapping area between each second portion 16 and the first extension portion 32 are closer, which can realize a better compensation effect and the manufacturing process is simplified. The plan pattern of each of the first portions 15 and the plan pattern of each of the second portions 16 may also be other patterns, such as parallelogram, which is not limited in the embodiments of the present disclosure.

For example, as illustrated in FIG. 2A, the second electrode 2 also extends substantially along the first direction; an orthographic projection of the second electrode 2 on the base substrate 5 overlaps with a part of the orthographic projection of the first body portion 31 on the base substrate 5; the second electrode 2 includes a plurality of first recessed portions 21 arranged in the first direction and recessed in a direction away from the first extension portions 32, and the first electrode 1 further includes a plurality of first protrusion portions 17 corresponding to the first portions 15 one by one, each of the plurality of first protrusion portions 17 is connected with the corresponding first portion 15, and the first protrusion portions 17 respectively extend into the first recessed portions 21 one by one. In addition, the first overlapping end 11 further includes the plurality of first protrusions 17, so that the structure of the thin film transistor is compact and the volume of the thin film transistor is reduced.

For example, in the embodiment illustrated in FIG. 2A, the first concave portion 21 is U-shaped, however, the shape of the first concave portion 21 is not limited to the shape of U, but may also be a shape of V, or an irregular concave shape, etc., and the embodiments of the present disclosure do not limit the specific shape of the first concave portion.

For example, as illustrated in FIG. 2A and FIG. 2B, the thin film transistor 10 further includes a semiconductor layer 6 overlapping with the gate electrode 3 in the direction perpendicular to the base substrate 5, and a gate insulation layer 7 covering the gate electrode 3. The first body portion 31 has an edge 311 near the first extension portion 32, and an orthographic projection of the edge 311 on the base substrate 5 at least partially overlaps with the orthographic projection of the first portions 15 on the base substrate 5. A width, in the first direction, of each of the first portions 15 is larger than a width, in the first direction, of a corresponding first protrusion portion 17 connected with the first portion 15, so as to prevent the first electrode 1 from breaking at the edge 311 of the first body portion 31. Because the first electrode 1 overlaps with the edge 311, there is an interlayer height difference at the position of the edge 311, and if the width of the first electrode 1 is too small, the problem of wire breakage easily occurs, as illustrated in FIG. 2B.

Elements and technical effects that are not mentioned for the embodiments illustrated in FIG. 2A-FIG. 2C are the same as those as those in FIG. 1A, the previous description can be referred, and the content is not repeated here.

At least one embodiment of the present disclosure also provides an array substrate, the array substrate comprises a plurality of first signal lines extending along a second direction and a plurality of second signal lines extending along a third direction, the second direction and the third direction intersect with each other, and the plurality of first signal lines intersect with the plurality of second signal lines to define a plurality of light control units arranged in an array; each of the light control units comprises any one of the thin film transistors provided by the embodiments of the present disclosure, the first direction intersects with both the second direction and the third direction, the gate electrode of the thin film transistor is electrically connected with one of the plurality of first signal lines, and the first electrode of the thin film transistor or the second electrode of the thin film transistor is electrically connected with one of the plurality of second signal lines, and the plurality of first signal lines and the plurality of second signal lines are all on the base substrate. For example, the array substrate is a display substrate or a light control substrate.

In a liquid crystal display device, in order to use the local dimming technology, for example, in the case of using a direct backlight unit or a side-in backlight unit, a light control panel may be added between the display liquid crystal panel and the backlight unit, and the light control panel may be a liquid crystal light control panel. The light control panel can control the light transmittance in a predetermined region, for parts with higher picture brightness (gray scale), the light transmittance of the corresponding regions of the light control panel is also high, allowing more light from the backlight unit to pass through; for parts with lower picture brightness, the light transmittance of the corresponding regions of the light control panel is also low, allowing less light from the backlight unit to pass through, thus achieving the purposes of improving the contrast of the display picture and enhancing the display image quality. For example, the light control panel may include the light control substrate provided by the embodiment of the present disclosure, and the light control substrate is used for controlling the orientations of liquid crystals in the light control panel to achieve the purpose of light control. The light control substrate provided by the embodiment of the disclosure is not limited to be used in a double-layer liquid crystal cell display panel, but can also be used in any other panel that needs to use the thin film transistor, so as to solve the problem of capacitance difference caused by the alignment deviation between the gate electrode and the source electrode/drain electrode of the thin film transistor and achieve the technical effect of compensating the capacitance difference. The array substrate may be the above-mentioned light control substrate, and the following description will take the case that the array substrate is the above-mentioned light control substrate as an example.

Figure 4A:
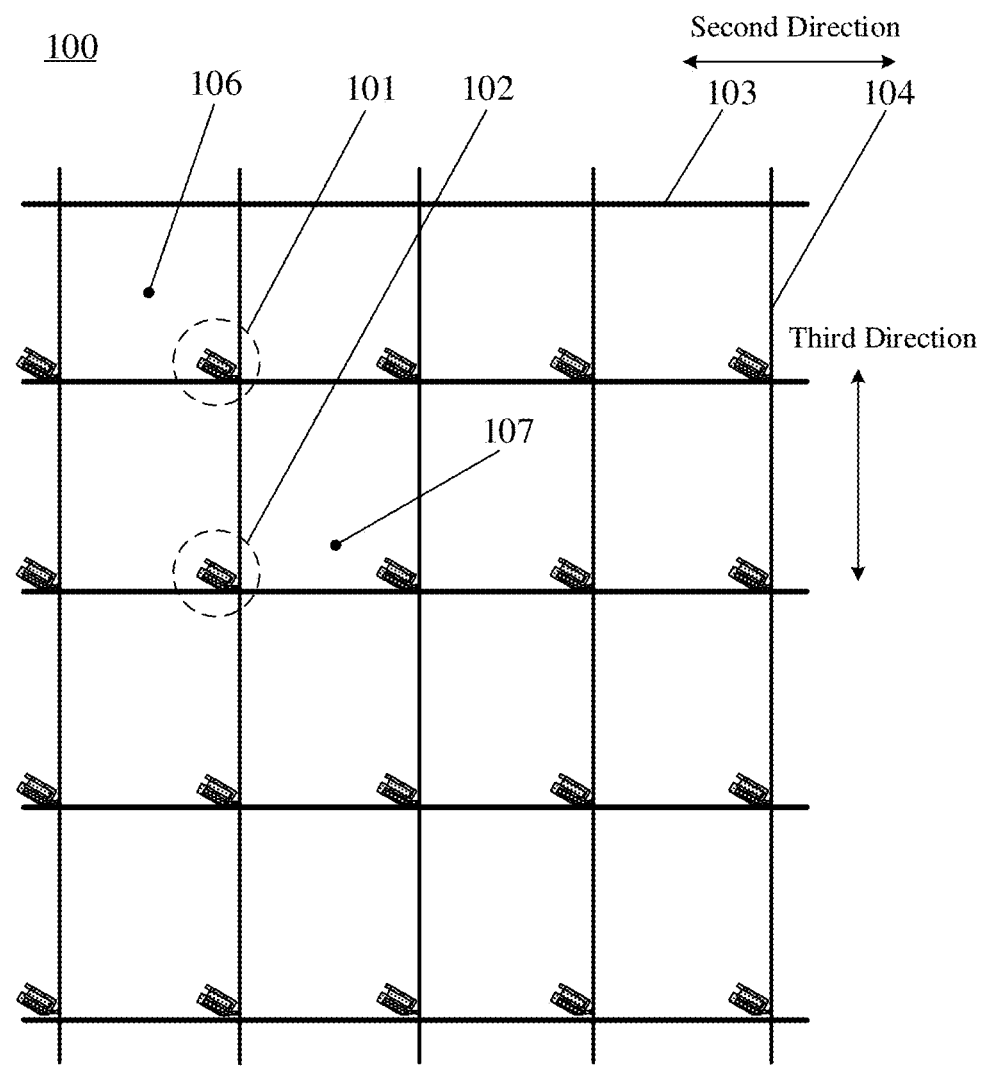
FIG. 4A is a schematically structural diagram of a light control substrate provided by an embodiment of the present disclosure.
Figure 4B:
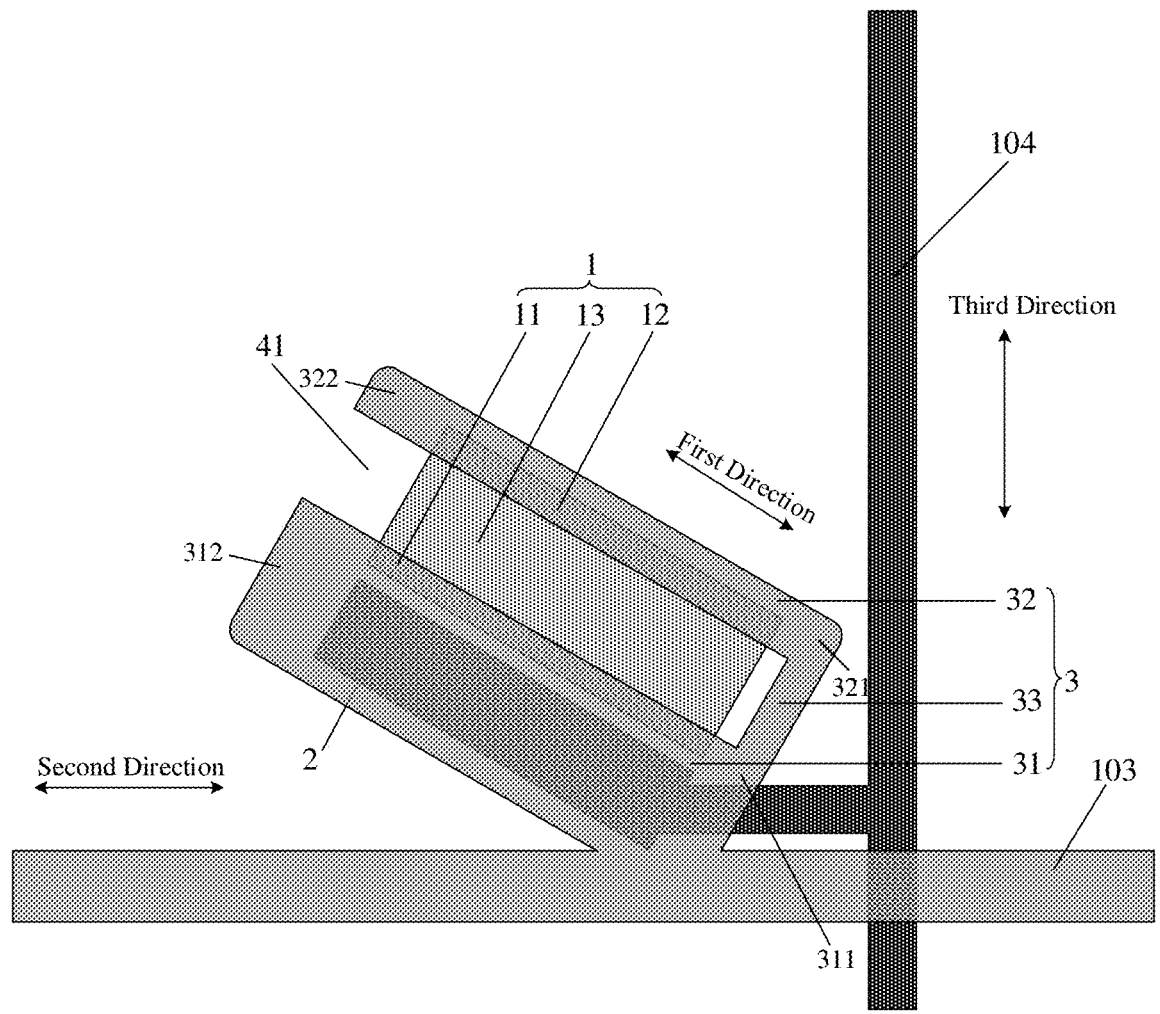
FIG. 4B is an enlarged schematic diagram of a part including thin film transistors in the first light control unit and the second light control unit of the light control substrate illustrated in FIG. 4A.

For example, FIG. 4A is a schematically structural diagram of the light control substrate provided in an embodiment of the present disclosure, and FIG. 4B is an enlarged schematic diagram of a part including the thin film transistors in the first light control unit and second light control unit of the light control substrate illustrated in FIG. 4A. As illustrated in FIG. 4A and FIG. 4B, a light control substrate 100 includes a plurality of first signal lines 103 extending along a second direction and a plurality of second signal lines 104 extending along a third direction. The second direction and the third direction intersect with each other, and the plurality of first signal lines 103 intersect with the plurality of second signal lines 104 to define a plurality of light control units 106/107 arranged in an array; each light control unit 106/107 includes any one of the thin film transistors provided by the embodiments of the present disclosure, the first direction intersects with both the second direction and the third direction, the gate electrode 3 of the thin film transistor is electrically connected with one of the plurality of first signal lines 103, the first electrode 1 of the thin film transistor or the second electrode 2 of the thin film transistor is electrically connected with one of the plurality of second signal lines 104, and the first signal lines 103 and the second signal lines 104 are all arranged on the base substrate 5. In the light control substrate 100, because the first direction intersects with both the second direction and the third direction, in the case that there is displacement deviation between the gate electrode of the thin film transistor and the first electrode of the thin film transistor in the horizontal direction or in the vertical direction or both, for example, there is the above deviation $\vec{\rho}$, the overlapping area of the gate electrode 3 and the first electrode 1 can remain basically unchanged, so that the capacitance compensation is realized, thereby preventing the coupling capacitance difference caused by the displacement deviation. That is, the coupling capacitance difference between the gate electrode and the source electrode/drain electrode of the thin film transistor between different rows because of the displacement deviation between the gate metal layer and the source electrode/drain electrode metal layer is prevented, thereby preventing the panel display abnormality, such as fine lines of display, caused by the coupling capacitance.

It should be noted that the feature "the plurality of first signal lines intersect with the plurality of second signal lines" does not refer to the two being electrically connected, and the light control substrate further includes an insulation layer located between the first signal lines and the second signal lines to insulate the first signal lines from the second signals.

For example, each of the first signal lines 103 is a first gate line and each of the second signal lines 104 is a first data line. The first gate line and the first data line are respectively configured to provide a first gate signal and a first data signal for driving the rotation of liquid crystal molecules (not illustrated) in the light control units 106/107 of the light control substrate 100, so as to realize the adjustment of the exit angle or intensity of the backlight performed by the light control substrate 100. For another example, in another embodiment of the present disclosure, each of the first signal lines 103 is a first gate line and each of the second signal lines 104 is a first data line. The thin film transistor included in each light control unit 7 is used as a switch element, and each light control unit 7 further includes a pixel electrode and a common electrode. As illustrated in FIG. 4B, the gate electrode 3 of the thin film transistor is connected with the first gate line 103 to receive the first gate signal, the second electrode 2 (e.g., source electrode) of the thin film transistor is connected with the first data line to receive the first data signal, and the first electrode 1 (e.g., drain electrode) of the thin film transistor is connected with the pixel electrode (not illustrated) to charge the pixel electrode when it is in an "On" state. The common electrode, pixel electrode, and the liquid crystal layer form a liquid crystal capacitor. When the pixel electrode is charged, an electric field is formed between the common electrode and the pixel electrode to control the rotation of liquid crystal molecules in the liquid crystal layer. Depending on whether the light control panel is a vertical type of electric field or a horizontal type of electric field, the common electrode and the pixel electrode may be located on a same substrate and adjacent to each other, or respectively located on different substrates and opposite to each other. The drawings do not show the pixel electrode and the common electrode, and those skilled in the art can refer to the conventional technology.

For example, in the embodiment illustrated in FIG. 4A and FIG. 4B, the plurality of first signal lines 103 and the plurality of second signal lines 104 are straight lines. The light control units include a first light control unit 106 and a second light control unit 107, the first light control unit 106 and the second light control unit 107 are respectively located in two adjacent rows of light control units arranged in the third direction, and the first light control unit 106 and the second light control unit 107 are respectively located in two adjacent columns of light control units arranged in the second direction. For example, the thin film transistor 101 included in the first light control unit 106 and the thin film transistor 102 included in the second light control unit 107 are connected to a same second signal line 104 and located on a same side of the same second signal line 104, and the first direction of the thin film transistor 101 included in the first light control unit 106 is basically parallel to the first direction of the thin film transistor 102 included in the second light control unit 107.

Figure 5A:
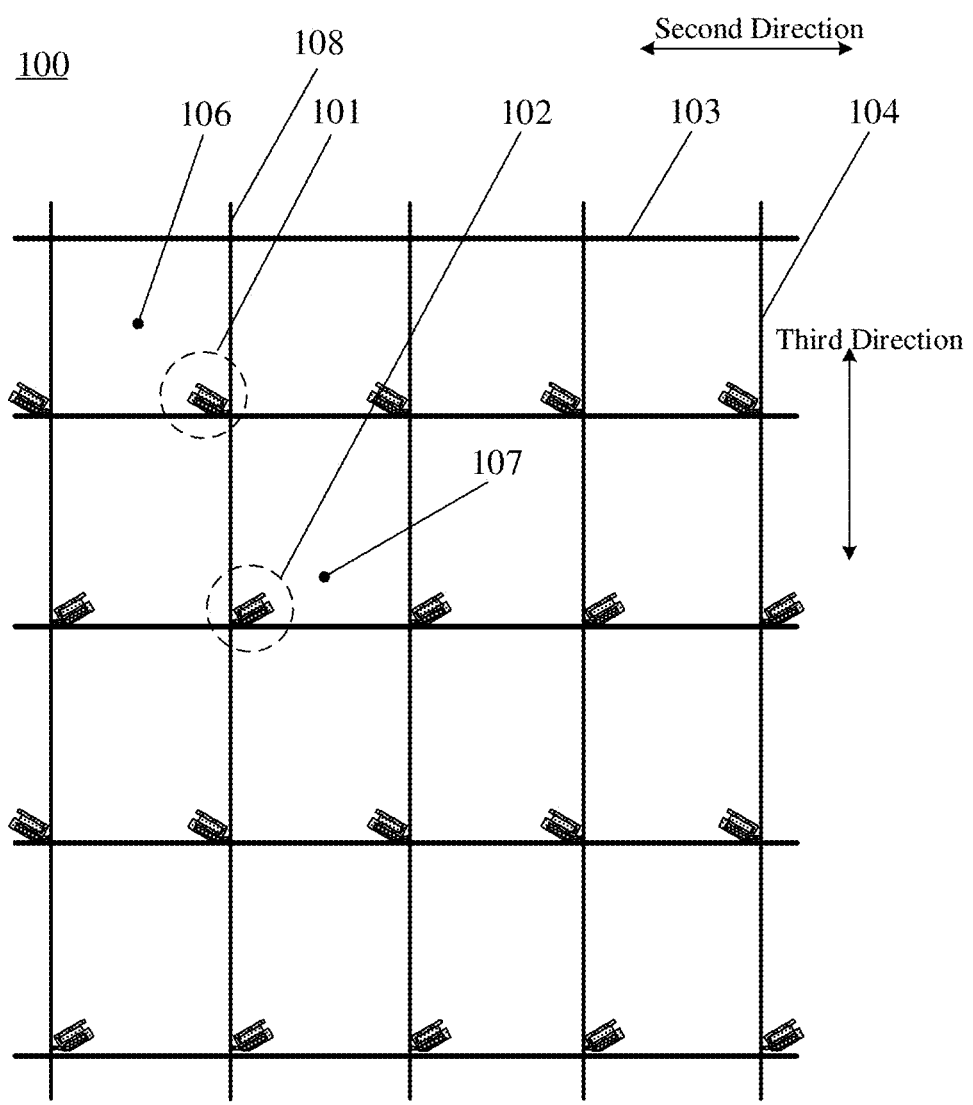
FIG. 5A is a schematically structural diagram of another light control substrate provided by an embodiment of the present disclosure.
Figure 5B:
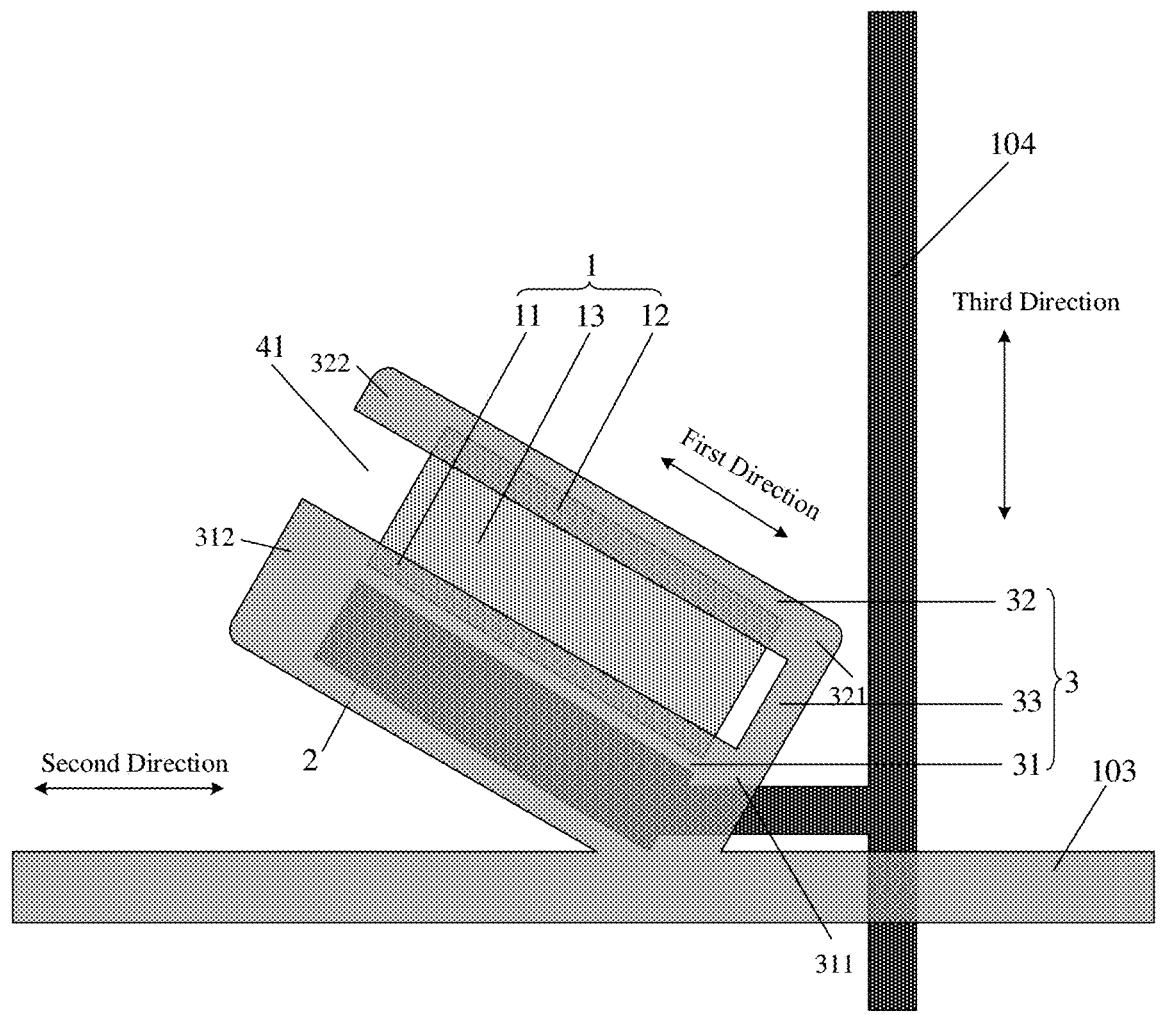
FIG. 5B is an enlarged schematic diagram of a part including a thin film transistor in a first light control unit of the light control substrate illustrated in FIG. 5A.
Figure 5C:
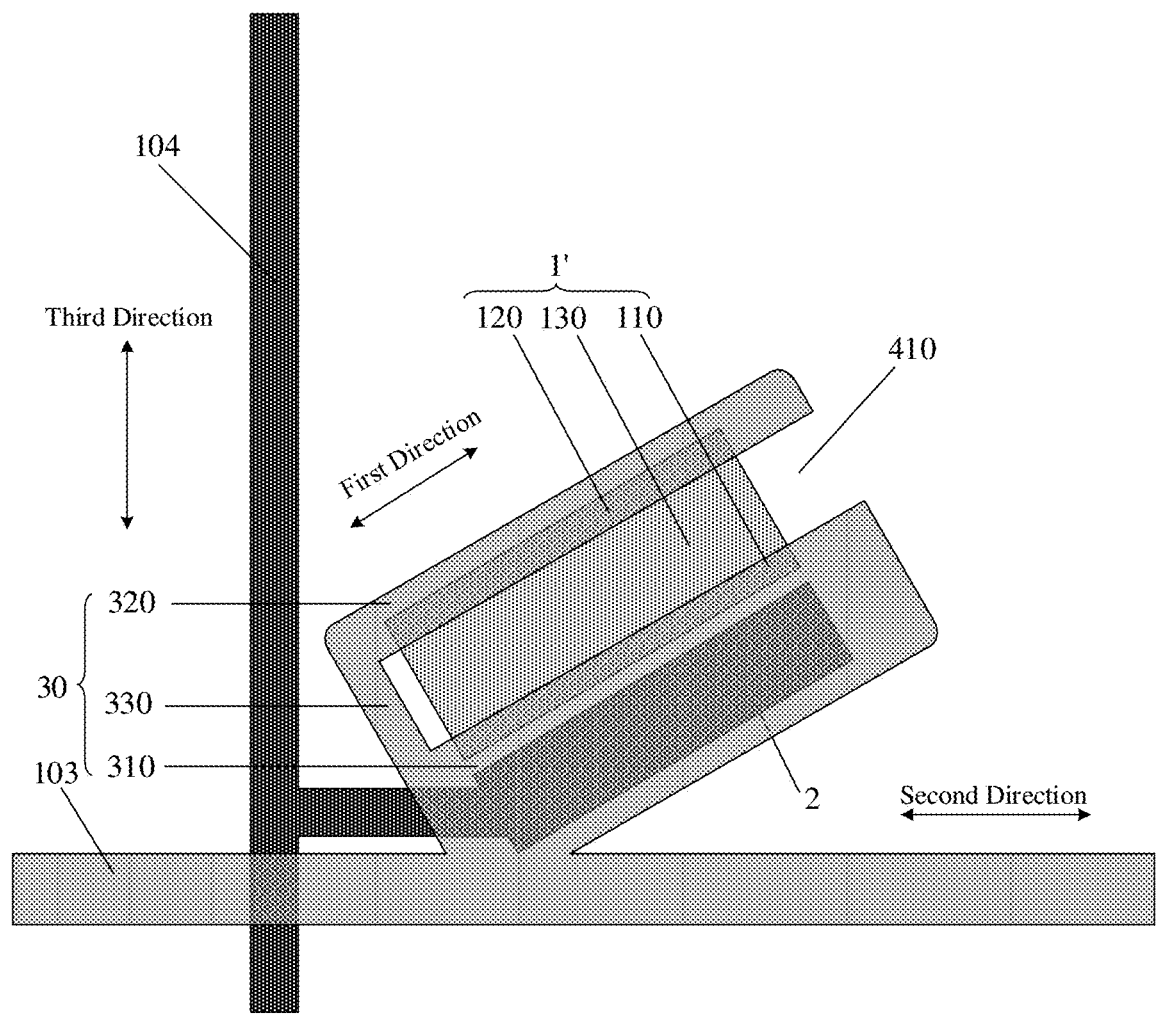
FIG. 5C is an enlarged schematic diagram of a part including a thin film transistor in a second light control unit of the light control substrate illustrated in FIG. 5A.

FIG. 5A is a schematic structural diagram of another light control substrate provided by an embodiment of the present disclosure, FIG. 5B is an enlarged schematic diagram of a part including thin film transistors in the first light control unit of the light control substrate illustrated in FIG. 5A, and FIG. 5C is an enlarged schematic diagram of a part including thin film transistors in the second light control unit of the light control substrate illustrated in FIG. 5A. The first direction of the thin film transistor 101 included in the first light control unit 106 intersects with the first direction of the thin film transistor 102 included in the second light control unit 107. For example, the thin film transistor 101 included in the first light control unit 106 and the thin film transistor 102 included in the second light control unit 107 are connected to the same second signal line 104 and respectively located on a first side and a second side of the same second signal line 104, and the first side of the same second signal line 104 and the second side of the same second signal line 104 are opposite to each other in the second direction, that is, the thin film transistors have a "Z" flip design, which can prevent the display panel adopting the light control substrate from generating shaking-head stripes, especially for large-size panels (for example, panels larger or equal to 65 inches). For example, the plurality of light control units include the first light control unit 106 and the second light control unit 107, and the first light control unit 106 and the second light control unit 107 are respectively located in two adjacent rows of light control units arranged in the third direction, and the first light control unit 106 and the second light control unit 107 are respectively located in two adjacent columns light control units arranged in the second direction, therefore, in the display panel adopting the light control substrate, the problem of poor display caused by the above displacement deviation of the thin film transistors in adjacent rows of display units or adjacent columns of display units can be prevented, thereby avoiding horizontal stripes or vertical stripes in display.

For example, in the embodiment illustrated in FIG. 5A-FIG. 5C, for the thin film transistor 101 included in the first light control unit 106, an area of an orthographic projection of the first compensation end 12 of the first electrode 1 on the base substrate 5 is a first area, and an area of an orthographic projection of the first overlapping end 11 of the first electrode 1 on the base substrate 5 is a third area;

for the thin film transistor 102 included in the second light control unit 107, an area of an orthographic projection of the first compensation end 12 of the first electrode 1 on the base substrate 5 is a second area; an orthographic projection of the first overlapping end 11 of the first electrode 1 on the base substrate 5 is a fourth area; the first area is different from the second area, the third area is different from the fourth area, and a sum of the first area and the second area is the same as a sum of the third area and the fourth area, so as to achieve a better compensation effect.

For example, in the embodiment illustrated in FIG. 5A-FIG. 5C, the thin film transistor 101 included in the first light control unit 106 is axially symmetrical with the thin film transistor 102 included in the second light control unit 107 with respect to an axis of symmetry along the third direction; or, the thin film transistor 101 included in the first light control unit 106 after being displaced along the third direction are axially symmetrical with the thin film transistor 102 included in the second light control unit 107 with respect to an axis of symmetry parallel to the second signal line 104, so that the compensation result of the whole light control substrate is uniform and consistent, and it is also convenient to prepare the thin film transistors of the whole light control substrate. In addition, in this way, the light control substrate provided in this embodiment can solve the capacitance compensation problem illustrated in FIG. 3A, and in the case that the displacement deviation occurs, the coupling capacitance of the thin film transistor 101 included in the first optical control unit 106 and the thin film transistor 102 included in the second optical control unit 107 can be basically kept unchanged, thus avoiding poor display, such as horizontal stripes in display.

Figure 6A:
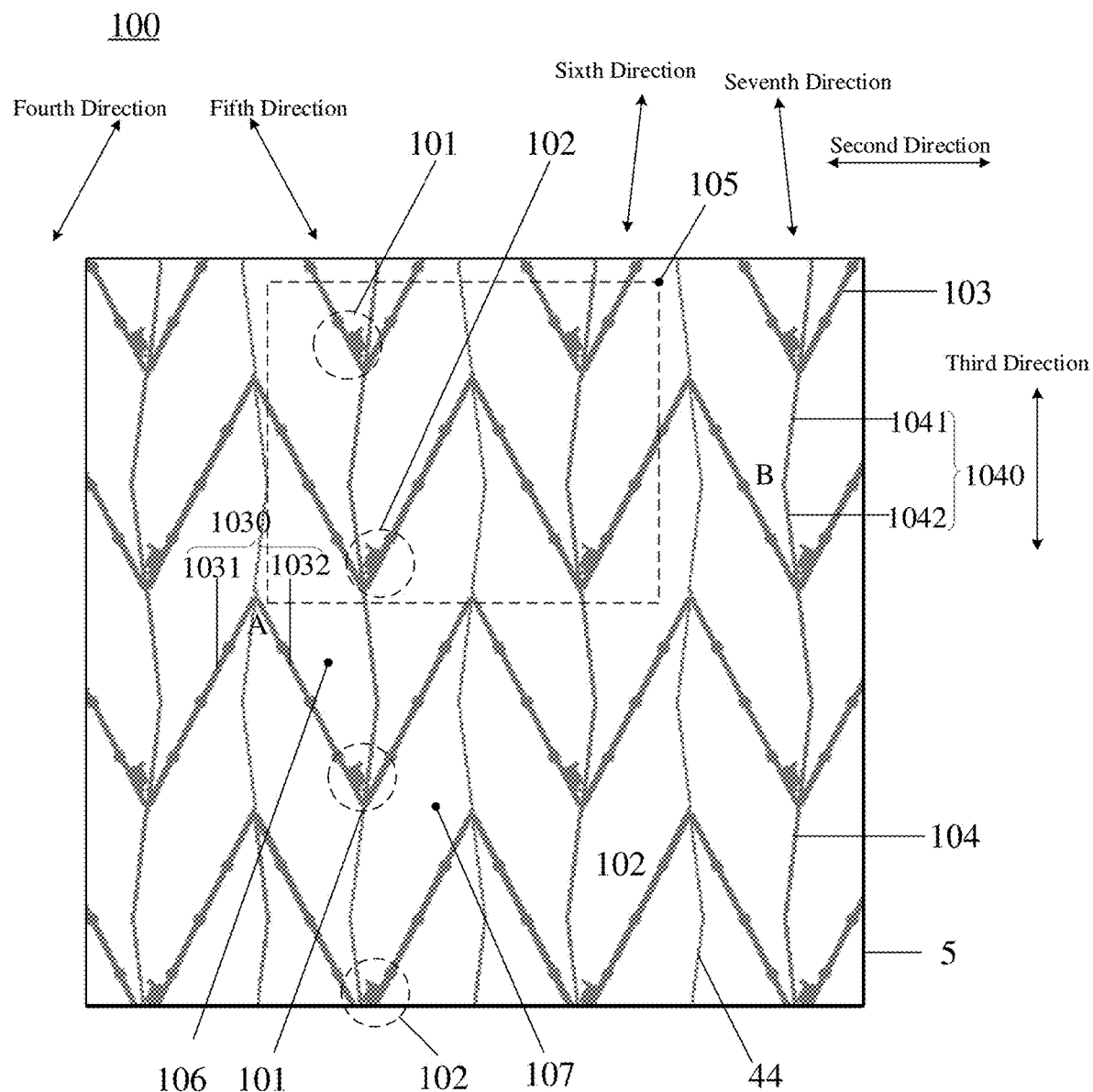
FIG. 6A is a schematically structural diagram of another light control substrate provided by an embodiment of the present disclosure.
Figure 6B:
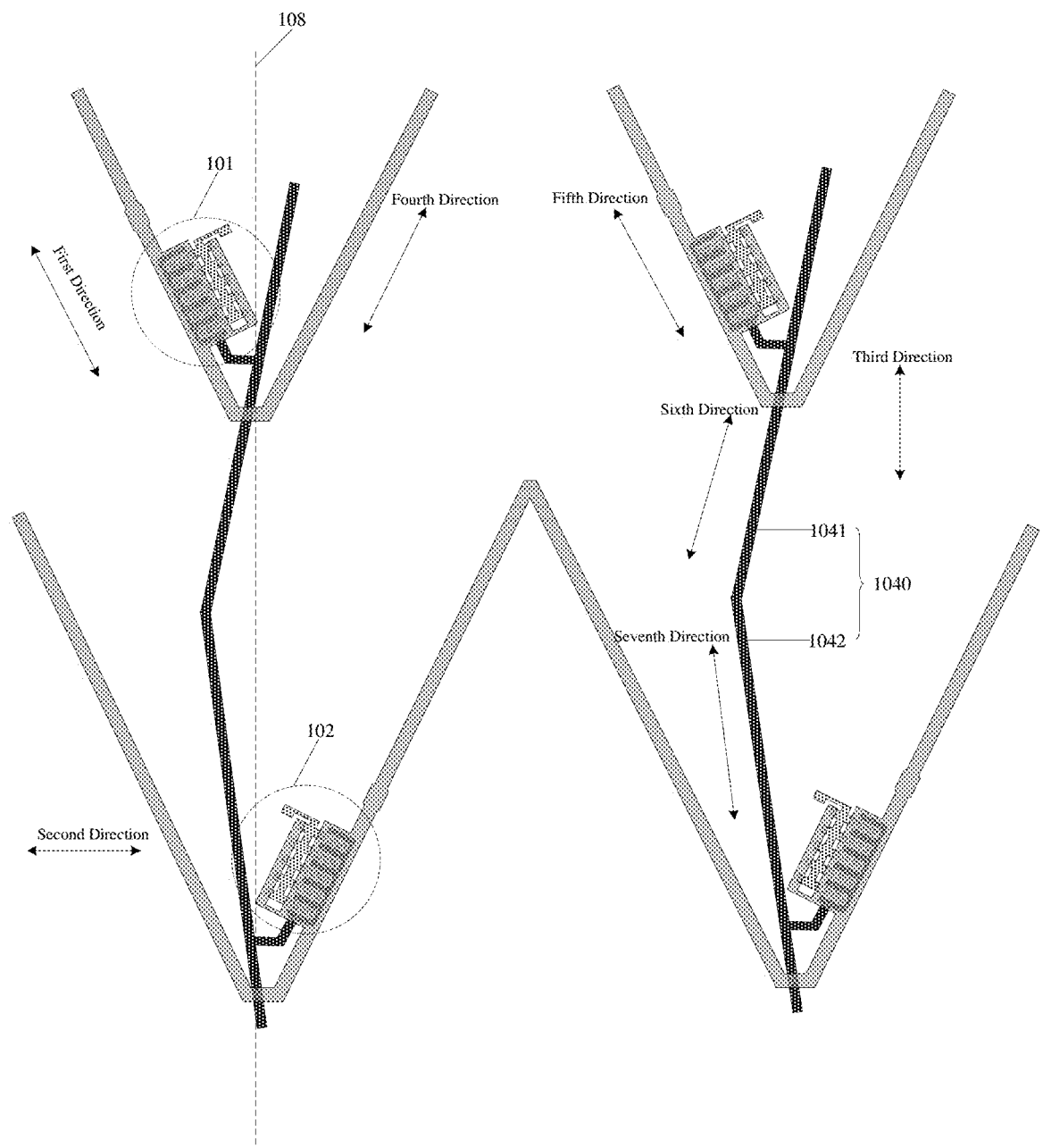
FIG. 6B is an enlarged schematic diagram of a part 105 in FIG. 6A.
Figure 6C:
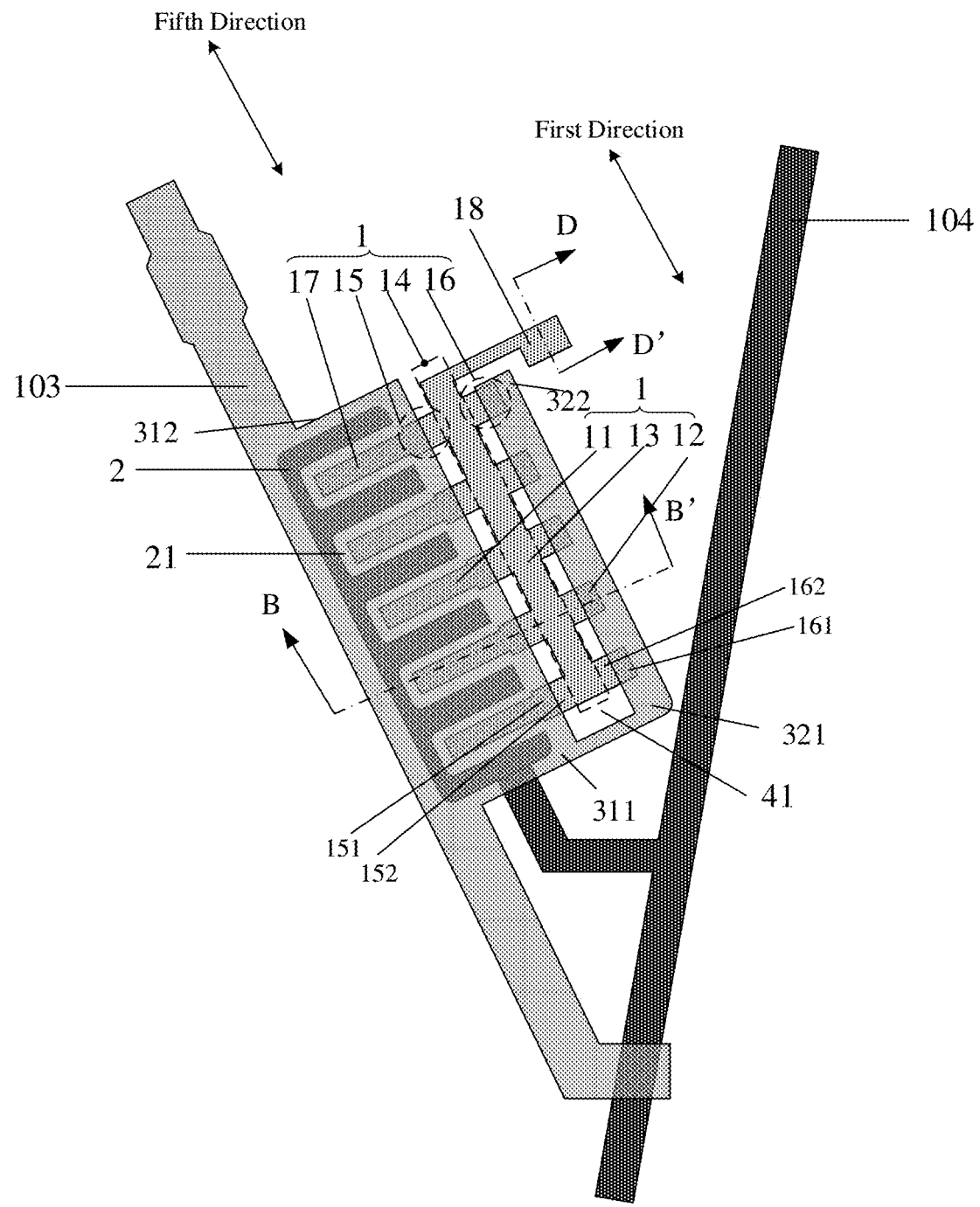
FIG. 6C is an enlarged schematic diagram of a part including a thin film transistor in a first light control unit of the light control substrate illustrated in FIG. 6A.
Figure 6D:
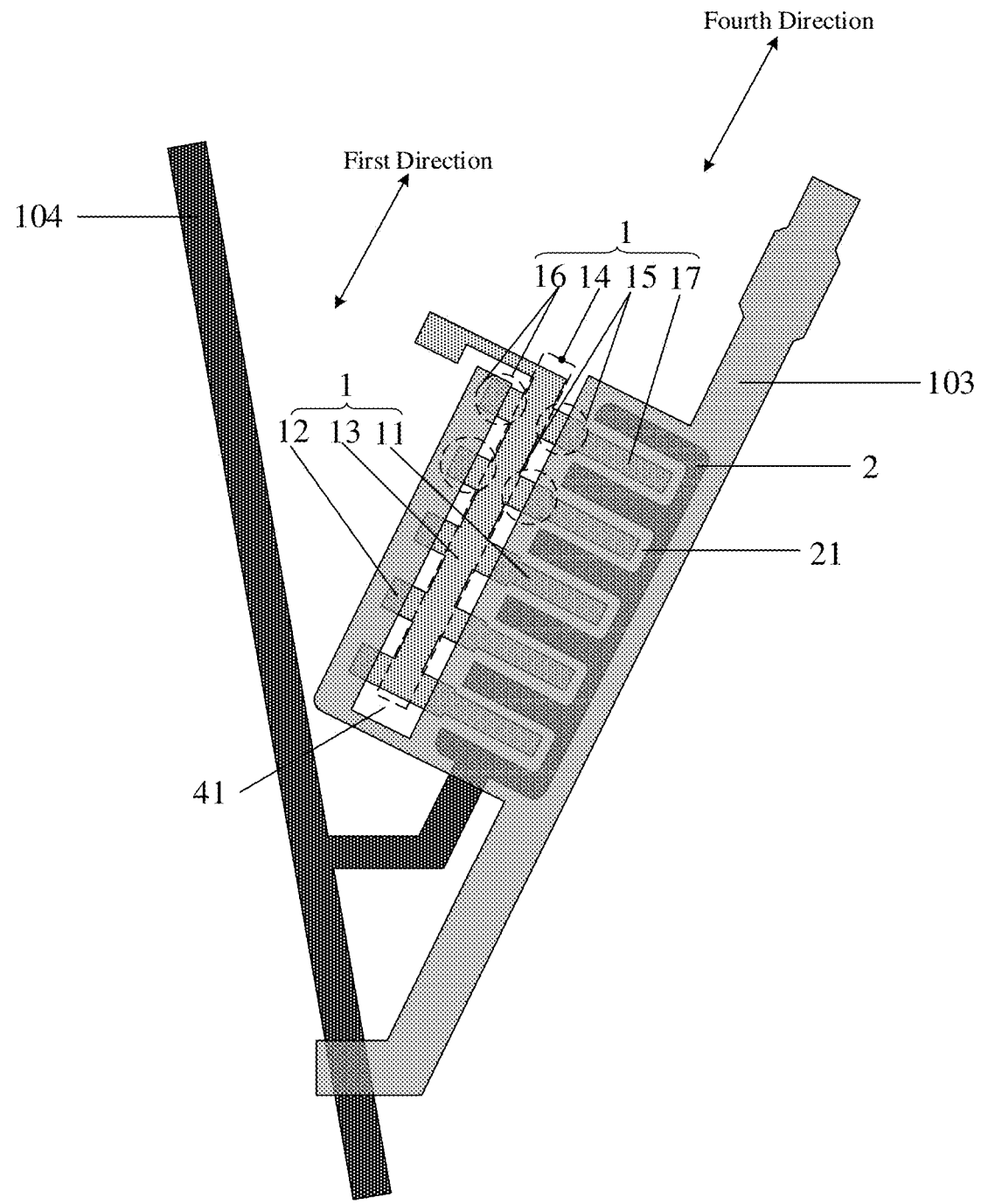
FIG. 6D is an enlarged schematic diagram of a part including a thin film transistor in a second light control unit of the light control substrate illustrated in FIG. 6A.

For example, in a light control substrate provided by another embodiment, at least a part of the plurality of first signal lines 103 and the plurality of second signal lines 104 are fold lines. Exemplarily, for example, FIG. 6A is a schematically structural diagram of another light control substrate provided by an embodiment of the present disclosure, FIG. 6B is an enlarged schematic diagram of a part 105 in FIG. 6A, FIG. 6C is an enlarged schematic diagram of a part including the thin film transistor in the first light control unit of the light control substrate illustrated in FIG. 6A, and FIG. 6D is an enlarged schematic diagram of a part including the thin film transistor in the second light control unit of the light control substrate illustrated in FIG. 6A. Generally, the plurality of signal lines of a display liquid crystal panel are straight lines extending along the second direction and the third direction that intersect with each other, and the planar shapes of a plurality of sub-pixel units defined by the intersecting signal lines are rectangular. Because at least a part of the first signal lines 103 and the second signal lines 104 are fold lines, the planar shape of the light control unit 106/107 is not rectangular, and the planar shape of the light control unit 106/107 is different from that of the sub-pixel unit, and the arrangement regularities of the light control units 106/107 is different from that of the sub-pixel units, so that the human eyes cannot feel the moire, and the effect of eliminating or improving the moire is achieved. In this case, for example, as illustrated in FIG. 6A-FIG. 6D, at least a part of the plurality of first signal lines 103 are fold lines and each fold line includes a plurality of first fold line units 1030 arranged continuously and periodically, one first fold line unit 1030 corresponds to one light control unit 106/107; each first fold line unit 1030 includes a first line segment 1031 extending along a fourth direction and a second line segment 1032 extending along a fifth direction, the fourth direction intersects with the fifth direction, and both the fourth direction and the fifth direction intersect with both the second direction and the third direction; the first line segment 1031 and the second line segment 1032 are sequentially arranged along the second direction, and the first line segment 1031 includes a first end connected with the second line segment 1032, the second line segment 1032 includes a first end connected with the first end of the first line segment 1031, and a connection point A of the first end of the first line segment 1031 and the first end of the second line segment 1032 is a knee point of the first fold line unit 1030; in the first light control unit 106, the first body portion 31 is connected with the first line segment 1031 of the first fold line unit 1030, for example, the two are integrally formed; furthermore, in the second light control unit 107, the first body portion 31 is connected with the second line segment 1032 of the first fold line unit 1030, for example, the two are integrally formed, so that the gate electrode 3 of the thin film transistor receives the first gate signals for driving the liquid crystal molecules in the light control unit of the light control substrate 100 to rotate. The first line segment 1031 and the second line segment 1032 of at least one of the first fold line units 1030 are symmetrical with respect to a central axis 108, along the third direction, of the light control unit 106/107 corresponding to the first fold line unit 1030. In this embodiment, the moire pattern can be improved, and at the same time, the problem of poor display caused by the above displacement deviation of the thin film transistors in adjacent rows of display units or adjacent columns of display units can be avoided, thereby preventing horizontal stripes or vertical stripes in display.

For example, as illustrated in FIG. 6B, the thin film transistor 101 included in the first light control unit 106 after being displaced along the third direction is axially symmetric with the thin film transistor 102 included in the second light control unit 107 with respect to the axis of symmetry 108 parallel to the second signal line 104, so that the compensation result of the whole light control substrate is uniform and consistent, and it is also convenient to the preparation of the thin film transistors of the whole light control substrate.

For example, as illustrated in FIG. 6B, the first direction of the thin film transistor 101 included in the first light control unit 106 is the same as the fifth direction, and the first direction of the thin film transistor 102 included in the second light control unit 107 is the same as the fourth direction, so as to facilitate the patterning when the gate electrode 3 is integrally formed with the first signal line 103 connected the gate electrode 3, which makes the structure of the thin film transistor and the first signal line 103 compact, and improves the space utilization rate in the light control unit.

For example, in the embodiment illustrated in FIG. 6A-FIG. 6D, the first line segment 1031 includes a second end connected with the second line segment 1032 of the first fold line unit 1030 adjacent thereto, and the second line segment 1032 includes a second end connected with the second end of the first line segment of the first fold line unit 1030 adjacent thereto; an orthographic projection of a connection point of the second end of the first line segment and the second end of the second line segment on the base substrate is located on an orthographic projection of the second signal line on the base substrate 5; in the first light control unit 106, the second end of the first line segment 1031 is closer to the thin film transistor 101 than the first end of the first line segment 1031; and in the second light control unit 107, the second end of the second line segment 1032 is closer to the thin film transistor 102 than the first end of the second line segment 1032.

For example, in the embodiment illustrated in FIG. 6A-FIG. 6D, at least a part of the plurality of second signal lines 104 are fold lines and each fold line includes a plurality of second fold line units 1040 arranged continuously and periodically, one second fold line unit 1040 corresponds to one light control unit 106/107; each second fold line unit 1040 includes a first line segment 1041 extending along a sixth direction and a second line segment 1042 extending along a seventh direction, the sixth direction intersects with the seventh direction, and both the sixth direction and the seventh direction intersect with both the second direction and the third direction; the first line segment 1041 and the second line segment 1042 are sequentially arranged along the third direction, and the first line segment 1042 includes a first end connected with the second line segment 1042, the second line segment 1041 includes a first end connected with the first end of the first line segment 1041, and a connection point B of the first end of the first line segment 1041 and the first end of the second line segment 1042 is a knee point of the second fold line unit 1040; in the first light control unit 106, the first electrode 1 of the thin film transistor 101 or the second electrode 2 of the thin film transistor 101 is connected with the first line segment 1041 of the second fold line unit; and in the second light control unit 107, the first electrode 1 of the thin film transistor or the second electrode 2 of the thin film transistor 102 is connected with the first line segment 1041 of the second fold line unit 1040, so that the first electrode 1 of the thin film transistor or the second electrode 2 of the thin film transistor receives the first data signals for driving the liquid crystal molecules in the light control unit of the light control substrate 100 to rotate.

In other embodiments, at least a part of the second signal line 104 may be a straight line. For example, the first signal line 103 is the fold line as illustrated in FIG. 6A, and the second signal line 104 is the straight line as illustrated in FIG. 5A.

As illustrated in FIG. 6C and FIG. 6D, the first extension portion 12 has a first end and a second end in the first direction, and the first body portion 11 has a first end and a second end in the first direction; in the first light control unit, the first end of the first extension portion 12 is closer to the second signal line 104 connected with the first light control unit than the second end of the first extension portion 12, and the first end of the first body portion 11 is closer to the second signal line 104 connected with the first light control unit than the second end of the first body portion 11. Furthermore, in the second light control unit, the first end of the first extension portion 12 is closer to the second signal line 104 connected to the second light control unit than the second end of the first extension portion 12, and the first end of the first body portion 11 is closer to the second signal line 104 connected to the second light control unit than the second end of the first body portion 11.

Figure 6E:
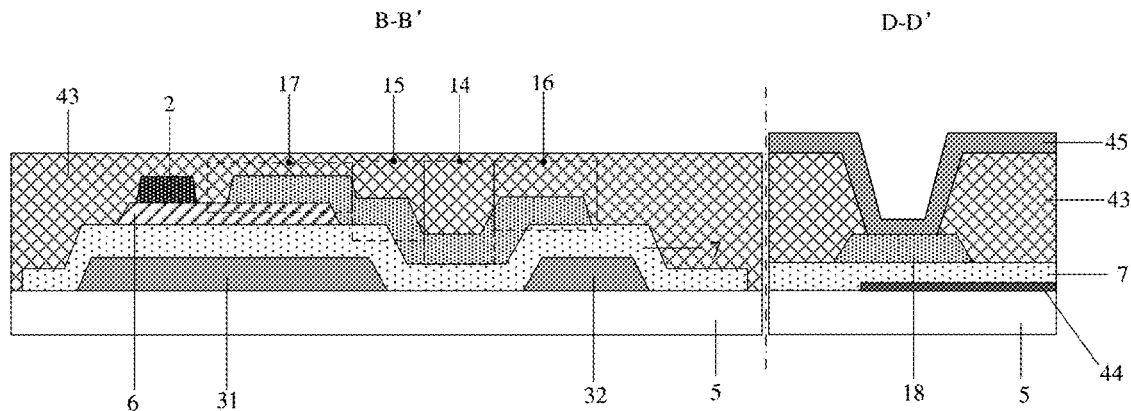
FIG. 6E is a schematic cross-sectional view taken along the line B-B' and the line D-D' in FIG. 6C.

FIG. 6E is a schematically cross-sectional view taken along the line B-B' and the line D-D' in FIG. 6C. As illustrated in FIG. 6E, the cross-section taken along the line B-B' can be referred to the previous description, and as illustrated in the schematic cross-section taken along the line D-D', the light control panel further includes a common electrode 44, an interlayer insulation layer 43, and a pixel electrode 45 that are located on the base substrate 5. The interlayer insulation layer 43 covers the first electrode 1 or the second electrode 2, and the first electrode 1 further includes an external connection portion 18 which is connected with the stripe portion 14 and extends in a direction intersecting with the first direction, a size of an end of the external connection portion 18 away from the stripe portion 14 in the first direction is larger than the line width of other parts of the external connection portion 18 in the first direction. The interlayer insulation layer 43 includes a via hole exposing the end of the external connection part 18 away from the strip-shaped part 14, and the pixel electrode 45 is electrically connected with the external connection part 18 through the via hole, so that the pixel electrode 45 is electrically connected with the first electrode 1. As illustrated in FIG. 6A, a planar pattern of the common electrode 44 is a fold line, that is, the common electrode 44 is a fold line, and the direction of the pixel electrode 45 is consistent with that of the common electrode 44, so as to form a slit electric field with the common electrode 44. For example, the light control panel is a liquid crystal light control panel, and the liquid crystal deflects under the action of the slit electric field of to realize light control.

Other unmentioned elements and corresponding technical effects of the embodiment illustrated in FIG. 6A are the same as those in FIG. 5A, the previous description can be referred.

Figure 7:
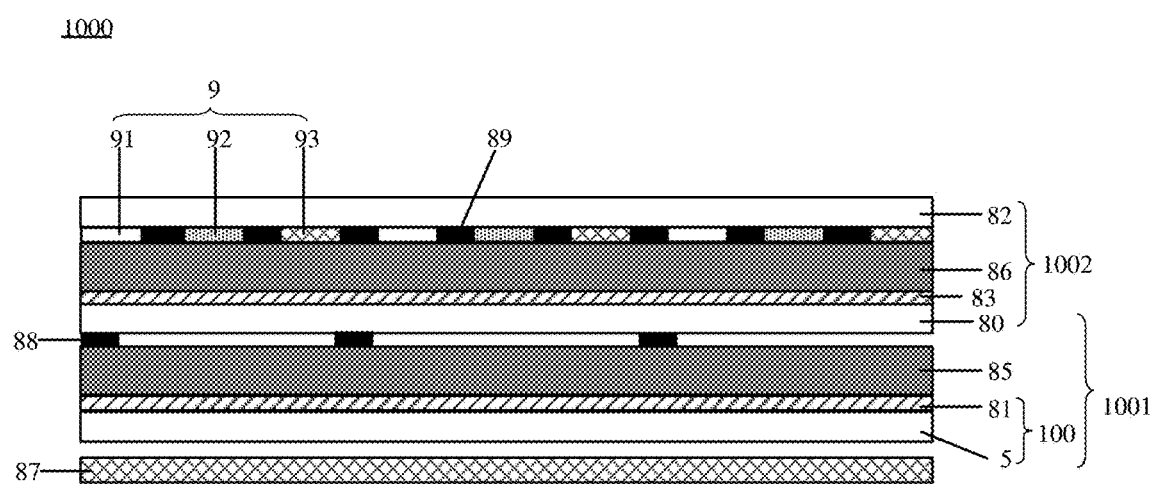
FIG. 7 is a schematically structural diagram of a display device provided by an embodiment of the present disclosure.

At least one embodiment of the disclosure also provides a display device, and the display device comprises any one of the light control substrates provided by the embodiments of the disclosure. Exemplarily, FIG. 7 is a schematically structural diagram of a display device provided by an embodiment of the present disclosure. As illustrated in FIG. 7, a display device 1000 includes any one of the array substrates 100 provided by the embodiments of the present disclosure, for example, the array substrate 100 is a light control substrate. The display device 1000 includes a light control liquid crystal panel 1001, a display liquid crystal panel 1002, and a backlight unit 87 that are stacked. The light control liquid crystal panel 1001 includes the abovementioned light control substrate 100; the backlight unit 87 is located on a side of the light control panel 2 away from the display liquid crystal panel 1, so that the backlight from the backlight unit 9 enters the light control liquid crystal panel 1001 first, and then enters the display liquid crystal panel 1002 after the light control liquid crystal panel 1001 adjusts the exit angle or intensity of the backlight as required, for example, to realize the conversion between a narrow viewing angle and a wide viewing angle, and to control the different luminous intensities at various positions of the display panel. The backlight unit 87 may be a direct-type backlight unit or a side-in type backlight unit, which is not limited by embodiments of the present disclosure.

The light control liquid crystal panel 1001 includes the light control substrate 100, a light control liquid crystal layer 85 and a first black matrix 88. The light control substrate 100 includes a light control drive circuit layer 81, the light control drive circuit layer 81 includes the first data lines, the second data lines, and the thin film transistors in the light control substrate 100 provided by the embodiments of the present disclosure.

For example, the display liquid crystal panel 1002 includes a plurality of signal lines, the plurality of signal lines includes a plurality of first display signal lines extending along the second direction and a plurality of second display signal lines extending along the third direction, and the plurality of first display signal lines intersect with the plurality of second display signal lines to define a plurality of sub-pixel units arranged in an array. For example, the display liquid crystal panel 1002 further includes a display drive circuit layer 83, a display liquid crystal layer 86, display pixels 9, and a second black matrix 89. For example, each of the display pixels 9 includes three sub-pixels with different colors, namely a first sub-pixel 91, a second sub-pixel 92 and a third sub-pixel 93. The embodiments of the present disclosure do not limit the amount and colors of sub-pixel units. For example, the drive circuit layer 83 of the display liquid crystal panel 1002 may include the thin film transistor provided by the embodiments of the present disclosure, so as to prevent the coupling capacitance difference of the thin film transistor caused by the displacement deviation between the gate electrode of the thin film transistor and the source electrode/drain electrode of the thin film transistor in the display liquid crystal panel 1002, thereby avoiding the display abnormality caused by the coupling capacitance difference.

For example, the plurality of first display signal lines are second gate lines and the plurality of second display signal lines are second data lines, and the second gate lines and the second data lines are respectively configured to provide second gate signals and second data signals for driving the rotation of liquid crystal molecules in the color sub-pixel units of the display liquid crystal panel 1002, or the first display signal lines and the second display signal lines are configured to be the second black matrix.

The display device 1000 is a liquid crystal display device. For example, the display device may be realized as any product or component with display function, such as mobile phone, tablet computer, monitor, notebook computer, ATM machine, etc. The display device 1000 can control the direction or intensity of the backlight incident on the display liquid crystal panel 1, and can avoid the coupling capacitance difference of the thin film transistor caused by the displacement deviation between the gate electrode of the thin film transistor and the source electrode/drain electrode of the thin film transistor, thereby avoiding the display abnormality caused by the coupling capacitance difference.

The described above are only exemplary implementations of the present disclosure, which is not intend to limit the scope of the present invention. The scope of the present disclosure should be defined by the claims.

What is claimed is:
1. An array substrate, comprising:
a base substrate;
a plurality of first signal lines extending along a second direction and a plurality of second signal lines extending along a third direction on the base substrate, wherein the second direction and the third direction intersect with each other, and the plurality of first signal lines intersect with the plurality of second signal lines to define a plurality of light control units in an array; and
the plurality of light control units comprises a plurality of first light control units and a plurality of second light control units, the plurality of first light control units comprises a plurality of first thin film transistors, respectively; the plurality of second light control units comprises a plurality of second thin film transistors, respectively; the first thin film transistors included in the first light control units are axially symmetrical with the second thin film transistors included in the second light control units with respect to an axis of symmetry along the third direction, respectively; or, the first thin film transistors included in the first light control units after being displaced along the third direction are axially symmetrical with the second thin film transistors included in the second light control units with respect to an axis of symmetry parallel to the second signal line, respectively;
wherein each of the first thin film transistors and the second thin film transistors is provided on the base substrate and comprises a gate electrode, a first electrode, and a second electrode,
wherein the gate electrode comprises:
a first body portion extending along a first direction;
a first extension portion extending substantially along the first direction, the first extension portion is electrically connected with the first body portion and spaced apart from the first body portion by a first spacing; and
a first connection portion connecting the first body portion and the first extension portion;
wherein the first electrode extends along the first direction and comprises:
a first overlapping end;
a first compensation end at a side of the first overlapping end away from the first body portion; and
a first intermediate portion connecting the first overlapping end and the first compensation end;
wherein the first extension portion has a first end and a second end in the first direction, and the first body portion has a first end and a second end in the first direction;
the first connection portion connects the first end of the first extension portion with the first end of the first body portion;
the second end of the first extension portion and the second end of the first body portion are at a same side of the first connection portion; and
wherein at least part of the second electrode extends along the first direction, an orthographic projection of the at least part of the second electrode on the base substrate falls within an orthographic projection of the first body portion of the gate electrode; and
the first direction has an included angle relative to the second direction, and the included angle is greater than 0 degree and less than 90 degrees.

2. The array substrate according to claim 1, wherein the first intermediate portion comprises a stripe portion extending along the first direction;
the first electrode comprises:
a plurality of first portions connected with the stripe portion, the plurality of first portions are provided on a first side of the stripe portion near the first body portion, and are spaced apart from each other along the first direction; and
a plurality of second portions connected with the stripe portion, the plurality of second portions are provided on a second side of the stripe portion near the first extension portion, and are spaced apart from each other along the first direction, and
the first overlapping end comprises at least a part of each of the plurality of first portions, and the first compensation end comprises at least a part of each of the plurality of second portions.

3. The array substrate according to claim 2, wherein each of the plurality of first portions comprises a first region and a second region, an orthographic projection of the first region on the base substrate is within an orthographic projection of the first body portion on the base substrate; an orthographic projection of the second region on the base substrate does not overlap with an orthographic projection of the first body portion on the base substrate, and the orthographic projection of the second region on the base substrate is within an orthographic projection of the first spacing on the base substrate;

each of the plurality of second portions comprises a third region and a fourth region, wherein an orthographic projection of the third region on the base substrate is within an orthographic projection of the first extension portion on the base substrate, and an orthographic projection of the fourth region on the base substrate does not overlap with an orthographic projection of the first extension portion of the first extension on the base substrate, and the orthographic projection of the fourth region on the base substrate is within an orthographic projection of the first spacing on the base substrate.

4. The array substrate according to claim 2, wherein the plurality of first portions and the plurality of second portions one by one, and the plurality of first portions and the plurality of second portions are axially symmetrical with the stripe portion as an axis of symmetry.

5. The array substrate according to claim 2, wherein each of the plurality of first portions is perpendicular to the first direction, and each of the plurality of second portions is perpendicular to the first direction.

6. The array substrate according to claim 2, wherein an orthographic projection of the second electrode on the base substrate at least partially overlaps with the orthographic projection of the first body portion on the base substrate;

the second electrode comprises a plurality of first recessed portions which are arranged in the first direction and recessed in a direction away from the first extension portion, the first electrode further comprises a plurality of first protrusion portions corresponding to the first portions one by one, each of the plurality of first protrusion portions is connected with a corresponding first portion, and the first protrusion portions respectively extend into the first recessed portions one by one; and the first overlapping end further comprises the plurality of first protrusion portions.

7. The array substrate according to claim 6, wherein the first body portion has an edge near the first extension portion, and an orthographic projection of the edge on the base substrate at least partially overlaps with orthographic projections of the plurality of first portions on the base substrate, and a width, in the first direction, of each of the first portions is larger than a width, in the first direction, of the first protrusion connected with the respective first portion.

8. The array substrate according to claim 1, wherein a width of the first extension portion in a direction perpendicular to the first direction is greater than 0 and less than or equal to 3 µm;

a ratio of the width of the first extension portion in the direction perpendicular to the first direction to a width of the first body portion in the direction perpendicular to the first direction is in a range of 0.2-0.3.

9. The array substrate according to claim 1, and an orthographic projection of the first connection portion on the base substrate does not overlap with both an orthographic projection of the first electrode on the base substrate and an orthographic projection of the second electrode on the base substrate.

10. The array substrate according to claim 1, wherein each first thin film transistor comprised in the corresponding first light control unit and a corresponding second thin film transistor comprised in the corresponding second light control unit are connected with a same second signal line and are respectively at a first side of the same second signal line and a second side of the same second signal line, and the first side of the same second signal line and the second side of the same second signal line are opposite to each other in the second direction; and the first light control units and the second light control units are respectively in two adjacent light control unit rows arranged in the third direction, and the first light control units and the second light control units are respectively in two adjacent light control unit columns arranged in the second direction.

11. The array substrate according to claim 1, wherein the first direction in each first thin film transistor comprised in the corresponding first light control unit intersects with the first direction in a corresponding second thin film transistor comprised in the corresponding second light control unit; and for each first thin film transistor comprised in the corresponding first light control unit, an area of an orthographic projection of the first compensation end of the first electrode on the base substrate is a first area, and an area of an orthographic projection of the first overlapping end of the first electrode on the base substrate is a third area, for each second thin film transistor comprised in the corresponding second light control unit, an area of an orthographic projection of the first compensation end of the first electrode on the base substrate is a second area, and an area of an orthographic projection of the first overlapping end of the first electrode on the base substrate is a fourth area;

a sum of the first area and the second area is same as a sum of the third area and the fourth area.

12. The array substrate according to claim 11, wherein at least a part of the plurality of first signal lines are fold lines, each of which comprises a plurality of first fold line units arranged continuously and periodically, and each of the first fold line units corresponds to a corresponding one of the light control units;

each of the first fold line units comprises a first line segment extending along a fourth direction and a second line segment extending along a fifth direction, wherein the fourth direction intersects with the fifth direction, and both the fourth direction and the fifth direction intersect with both the second direction and the third direction;

the first line segment and the second line segment are sequentially arranged in the second direction, the first line segment comprises a first end connected with the second line segment, and the second line segment comprises a first end connected with the first end of the first line segment, and a connection point of the first end of the first line segment and the first end of the second line segment is a knee point of the first fold line unit;

in the first light control unit, the first body portion is connected with the first line segment of the first fold line unit; and in the second light control unit, the first body portion is connected with the second line segment of the first fold line unit.

13. The array substrate according to claim 12, wherein the first direction in the first thin film transistors comprised in the first light control units respectively is same as the fifth direction, and the first direction in the second thin film transistors comprised in the second light control units respectively is same as the fourth direction.

14. The array substrate according to claim 12, wherein the first line segment comprises a second end connected with a second end of the second line segment of the first fold line unit adjacent thereto, and the second line segment comprises a second end connected with a second end of the first line segment of first fold line unit adjacent thereto; an orthographic projection of a connection point of the second end of the first line segment and the second end of the second line segment on the base substrate is on an orthographic projection of the second signal line on the base substrate;
   in the first light control unit, the second end of the first line segment is closer to the thin film transistor than the first end of the first line segment; and
   in the second light control unit, the second end of the second line segment is closer to the thin film transistor than the first end of the second line segment.

15. The array substrate according to claim 11, wherein
   at least a part of the plurality of second signal lines are fold lines, each of which comprises a plurality of second fold line units arranged continuously and periodically, and each of the second fold line units corresponds to a corresponding one of the light control units;
   each of the second fold line units comprises a first line segment extending along a sixth direction and a second line segment extending along a seventh direction, wherein the sixth direction intersects with the seventh direction, and both the sixth direction and the seventh direction intersect with both the second direction and the third direction;
   the first line segment and the second line segment are sequentially arranged along the third direction, wherein the first line segment comprises a first end connected with the second line segment, the second line segment comprises a first end connected with the first end of the first line segment, and a connection point between the first end of the first line segment and the first end of the second line segment is a knee point of the second fold line unit;
   in the first light control unit, the first electrode of the thin film transistor or the second electrode of the thin film transistor is connected with the first line segment of the second fold line unit; and
   in the second light control unit, the first electrode of the thin film transistor or the second electrode of the thin film transistor is connected with the second line segment of the second fold line unit.

16. A display device, comprising an array substrate wherein the array substrate comprises:
   a base substrate;
   a plurality of first signal lines extending along a second direction and a plurality of second signal lines extending along a third direction on the base substrate, wherein the second direction and the third direction intersect with each other, and the plurality of first signal lines intersect with the plurality of second signal lines to define a plurality of light control units in an array; and
   the plurality of light control units comprises a plurality of first light control units and a plurality of second light control units, the plurality of first light control units comprises a plurality of first thin film transistors, respectively; the plurality of second light control units comprises a plurality of second thin film transistors, respectively; the first thin film transistors included in the first light control units are axially symmetrical with the second thin film transistors included in the second light control units with respect to an axis of symmetry along the third direction, respectively; or, the first thin film transistors included in the first light control units after being displaced along the third direction are axially symmetrical with the second thin film transistors included in the second light control units with respect to an axis of symmetry parallel to the second signal line, respectively;
   wherein each of the first thin film transistors and the second thin film transistors is provided on the base substrate and comprises a gate electrode, a first electrode, and a second electrode,
   wherein the gate electrode comprises:
   a first body portion extending along a first direction;
   a first extension portion extending substantially along the first direction, the first extension portion is electrically connected with the first body portion and spaced apart from the first body portion by a first spacing; and
   a first connection portion connecting the first body portion and the first extension portion;
   wherein the first electrode extends along the first direction and comprises:
   a first overlapping end;
   a first compensation end at a side of the first overlapping end away from the first body portion; and
   a first intermediate portion connecting the first overlapping end and the first compensation end;
   wherein the first extension portion has a first end and a second end in the first direction, and the first body portion has a first end and a second end in the first direction;
   the first connection portion connects the first end of the first extension portion with the first end of the first body portion;
   the second end of the first extension portion and the second end of the first body portion are at a same side of the first connection portion; and
   wherein at least part of the second electrode extends along the first direction, an orthographic projection of the at least part of the second electrode on the base substrate falls within an orthographic projection of the first body portion of the gate electrode; and
   the first direction has an included angle relative to the second direction, and the included angle is greater than 0 and less than 90 degrees;
   wherein the array substrate is a light control substrate, and the display device further comprises:
   a light control panel comprising the light control substrate;
   a display liquid crystal panel stacked with the light control panel and comprising a plurality of first display signal lines extending along the second direction and a plurality of second display signal lines extending along the third direction, wherein the plurality of first display signal lines intersect with the plurality of second display signal lines to define a plurality of sub-pixel units in an array; and
   a backlight unit at a side of the light control panel away from the display liquid crystal panel, wherein the light control panel is configured to allow backlight from the backlight unit to be incident into the display liquid crystal panel via the light control panel.

* * * * *